(12) United States Patent
Gauthier et al.

(10) Patent No.: US 11,537,021 B2
(45) Date of Patent: Dec. 27, 2022

(54) SWITCHABLE OBJECTS AND METHODS OF MANUFACTURE

(71) Applicant: Solutia Canada Inc., Vancouver (CA)

(72) Inventors: Simon James Gauthier, Vancouver (CA); Duhane Lam, Vancouver (CA); Jonathan Ross Sargent, Vancouver (CA); James Daniel Senior, Surrey (CA); Cynthia Elizabeth Shippam, Vancouver (CA); Peter Alexander Von Hahn, Vancouver (CA)

(73) Assignee: Solutia Canada Inc.

(*) Notice: Subject to any disclaimer, the term of this patent is extended or adjusted under 35 U.S.C. 154(b) by 804 days.

(21) Appl. No.: 16/285,748

(22) Filed: Feb. 26, 2019

(65) Prior Publication Data

US 2019/0310531 A1    Oct. 10, 2019

Related U.S. Application Data

(63) Continuation of application No. 15/106,180, filed as application No. PCT/CA2014/051226 on Dec. 17, 2014, now Pat. No. 10,254,617.

(Continued)

(51) Int. Cl.
*G02F 1/161* (2006.01)
*B23K 26/364* (2014.01)
(Continued)

(52) U.S. Cl.
CPC ............... *G02F 1/161* (2013.01); *B05D 1/02* (2013.01); *B05D 1/265* (2013.01); *B05D 1/32* (2013.01);
(Continued)

(58) Field of Classification Search
None
See application file for complete search history.

(56) References Cited

U.S. PATENT DOCUMENTS 4,048,464 A * 9/1977 Gale .................. B23K 26/0643
                                                    219/121.67
4,297,401 A   10/1981 Chern et al.
(Continued)

FOREIGN PATENT DOCUMENTS

CN      1784631 A    6/2006
CN    102323698 A    1/2012
(Continued)

OTHER PUBLICATIONS

Co-pending U.S. Appl. No. 15/106,180, filed Dec. 17, 2013; Gauthier, et al. now U.S. Pat. No. 10,254,617.
(Continued)

*Primary Examiner* — Geoffrey S Evans
(74) *Attorney, Agent, or Firm* — Michael K. Carrier

(57) ABSTRACT

A simplified switchable object and methods of making same are provided. The methods may include steps of applying a switchable material on a first surface of a first substrate, the switchable material having a thickness and a shape; applying a barrier material on the first substrate, circumferential to the switchable material; and applying a second substrate over top of, and in contact with, the switchable material and the barrier material, the first substrate, second substrate and barrier material defining a closed chamber encapsulating the switchable material. The methods may further include a step of applying a seal material.

18 Claims, 7 Drawing Sheets

Related U.S. Application Data

(60) Provisional application No. 61/949,093, filed on Mar. 6, 2014, provisional application No. 61/918,487, filed on Dec. 19, 2013.

(51) Int. Cl.

| | | |
|---|---|---|
| *B32B 37/02* | (2006.01) | |
| *C09K 9/00* | (2006.01) | |
| *C09K 9/02* | (2006.01) | |
| *B32B 38/00* | (2006.01) | |
| *G02F 1/153* | (2006.01) | |
| *B05D 1/02* | (2006.01) | |
| *B05D 1/26* | (2006.01) | |
| *B05D 1/32* | (2006.01) | |
| *C23C 14/06* | (2006.01) | |
| *C23C 14/08* | (2006.01) | |
| *C23C 14/18* | (2006.01) | |
| *C23C 14/34* | (2006.01) | |
| *C23C 14/58* | (2006.01) | |
| *G02F 1/155* | (2006.01) | |
| *B32B 37/20* | (2006.01) | |

(52) U.S. Cl.
CPC ............. *B23K 26/364* (2015.10); *B32B 37/02* (2013.01); *B32B 38/145* (2013.01); *C09K 9/00* (2013.01); *C09K 9/02* (2013.01); *C23C 14/0605* (2013.01); *C23C 14/086* (2013.01); *C23C 14/185* (2013.01); *C23C 14/34* (2013.01); *C23C 14/584* (2013.01); *C23C 14/5873* (2013.01); *G02F 1/155* (2013.01); *G02F 1/1533* (2013.01); *B32B 37/203* (2013.01); *B32B 38/0004* (2013.01); *B32B 2309/105* (2013.01); *B32B 2310/0831* (2013.01); *B32B 2310/0843* (2013.01); *B32B 2457/208* (2013.01); *G02F 2201/56* (2013.01)

(56) References Cited

U.S. PATENT DOCUMENTS

| | | |
|---|---|---|
| 4,368,945 A | 1/1983 | Fujimori et al. |
| 4,418,102 A | 11/1983 | Ferrato |
| 4,695,490 A | 9/1987 | McClelland et al. |
| 4,911,948 A | 3/1990 | McIntyre |
| 4,997,468 A * | 3/1991 | Dimitrov ............... B23K 26/06 65/160 |
| 5,190,826 A | 3/1993 | Asahina et al. |
| 5,308,805 A | 5/1994 | Baker et al. |
| 5,379,146 A | 1/1995 | Defendini |
| 5,596,023 A | 1/1997 | Tsubota et al. |
| 5,596,024 A | 1/1997 | Horie et al. |
| 5,617,812 A | 4/1997 | Balderson et al. |
| 5,724,187 A | 3/1998 | Varaprasad et al. |
| 5,822,107 A | 10/1998 | Lefrou et al. |
| 5,889,608 A | 3/1999 | Buffat et al. |
| 6,001,487 A | 12/1999 | Ladang et al. |
| 6,157,480 A | 12/2000 | Anderson et al. |
| 6,195,193 B1 | 2/2001 | Anderson et al. |
| 6,219,126 B1 | 4/2001 | Von Gutfeld |
| 6,248,204 B1 | 6/2001 | Schuft |
| 6,317,248 B1 | 11/2001 | Agrawal et al. |
| 6,373,618 B1 | 4/2002 | Agrawal et al. |
| 6,606,104 B1 | 8/2003 | Kondo et al. |
| 6,627,318 B2 | 9/2003 | Bonis et al. |
| 6,665,107 B2 | 12/2003 | Forgette et al. |
| 6,821,629 B2 | 11/2004 | Garnier et al. |
| 6,825,965 B2 | 11/2004 | Minami et al. |
| 6,831,725 B2 | 12/2004 | Niiya |
| 7,002,720 B2 | 2/2006 | Beteille et al. |
| 7,003,655 B2 | 4/2006 | Beteille et al. |
| 7,525,714 B2 | 4/2009 | Poll et al. |
| 7,777,055 B2 | 8/2010 | Branda et al. |
| 7,834,098 B2 | 11/2010 | Wenning et al. |
| 7,846,220 B2 | 12/2010 | Hatsuda |
| 7,876,493 B2 | 1/2011 | Park et al. |
| 7,932,198 B2 | 4/2011 | Hulme et al. |
| 8,007,751 B2 | 8/2011 | Panz et al. |
| 8,102,585 B2 | 1/2012 | Giron et al. |
| 8,164,818 B2 | 4/2012 | Collins et al. |
| 8,349,441 B2 | 1/2013 | Hofmann et al. |
| 8,377,193 B2 | 2/2013 | Lortz et al. |
| 8,426,478 B2 | 4/2013 | Debrowski et al. |
| 8,501,861 B2 | 8/2013 | Kohlstruk et al. |
| 8,597,789 B2 | 12/2013 | Schulz et al. |
| 8,599,466 B2 | 12/2013 | Agrawal et al. |
| 8,599,467 B2 | 12/2013 | Agrawal et al. |
| 8,614,256 B2 | 12/2013 | Panz et al. |
| 8,647,876 B2 | 2/2014 | Shimoda et al. |
| 8,670,173 B2 | 3/2014 | Wang et al. |
| 8,687,258 B2 | 4/2014 | Lam et al. |
| 8,772,423 B2 | 7/2014 | de Gans et al. |
| 8,802,744 B2 | 8/2014 | Knott et al. |
| 8,882,901 B2 | 11/2014 | Michael et al. |
| 8,883,932 B2 | 11/2014 | Brugger et al. |
| 8,995,039 B2 | 3/2015 | Bartug et al. |
| 9,671,665 B2 | 6/2017 | Brown |
| 10,254,617 B2 | 4/2019 | Gauthier et al. |
| 10,684,525 B2 | 6/2020 | Gauthier et al. |
| 2002/0039224 A1 | 4/2002 | Johnson et al. |
| 2002/0044331 A1 | 4/2002 | Agrawal et al. |
| 2002/0075552 A1 | 6/2002 | Poll et al. |
| 2003/0137715 A1 | 7/2003 | Poll |
| 2003/0227663 A1 | 12/2003 | Agrawal et al. |
| 2004/0032658 A1 | 2/2004 | Fleming |
| 2004/0141141 A1 | 7/2004 | Ota et al. |
| 2004/0159642 A1 * | 8/2004 | Nepomuceno ......... H01L 21/78 219/121.69 |
| 2005/0067007 A1 | 3/2005 | Toft |
| 2005/0195488 A1 | 9/2005 | McCabe et al. |
| 2007/0020442 A1 | 1/2007 | Giron et al. |
| 2007/0152956 A1 | 7/2007 | Danner et al. |
| 2008/0068529 A1 | 3/2008 | Tebbit |
| 2008/0170182 A1 | 7/2008 | Schindler et al. |
| 2008/0186559 A1 | 8/2008 | Willard et al. |
| 2008/0239452 A1 | 10/2008 | Xu |
| 2009/0035642 A1 | 2/2009 | Hatsuda |
| 2009/0181203 A1 | 7/2009 | Valentin et al. |
| 2009/0191670 A1 * | 7/2009 | Heitzinger .......... H01L 27/1218 438/151 |
| 2009/0262411 A1 | 10/2009 | Karmhag et al. |
| 2009/0303565 A1 * | 12/2009 | Karmhag ............. G02F 1/1533 359/265 |
| 2010/0009588 A1 * | 1/2010 | Ray ..................... G09F 13/22 445/24 |
| 2010/0277788 A1 | 11/2010 | Webb et al. |
| 2010/0315693 A1 * | 12/2010 | Lam .................... G02B 5/223 359/241 |
| 2011/0128137 A1 | 6/2011 | Varaprasad et al. |
| 2011/0222138 A1 | 9/2011 | Piroux et al. |
| 2012/0309244 A1 | 12/2012 | Solarsku et al. |
| 2013/0210199 A1 * | 8/2013 | Chen .................. C23C 16/345 438/127 |
| 2013/0235323 A1 | 9/2013 | Sotzing et al. |
| 2013/0271811 A1 | 10/2013 | Lam et al. |
| 2014/0014179 A1 | 1/2014 | Swiegers et al. |
| 2014/0043667 A1 * | 2/2014 | Bergh .................. G02F 1/1533 359/265 |
| 2014/0340730 A1 | 11/2014 | Bergh et al. |
| 2016/0033841 A1 | 2/2016 | Gaithier et al. |
| 2019/0310531 A1 | 10/2019 | Gaithier et al. |
| 2021/0088868 A1 | 3/2021 | Gauthier et al. |

FOREIGN PATENT DOCUMENTS

| | | |
|---|---|---|
| EP | 0 477 065 B1 | 3/1996 |
| GB | 2 343 965 A | 5/2000 |
| JP | 61-142157 A | 6/1986 |
| JP | H04-005630 A | 1/1992 |
| JP | H07149362 A | 6/1995 |
| JP | 2002-268096 A | 9/2002 |

(56) References Cited

FOREIGN PATENT DOCUMENTS

| | | |
|---|---|---|
| JP | 2003-140197 A | 5/2003 |
| JP | 2004-524570 A | 8/2004 |
| JP | 2006337635 A | 12/2006 |
| JP | 2007-033545 A | 2/2007 |
| JP | 2008-192856 A | 8/2008 |
| JP | 2008-209695 A | 9/2008 |
| JP | 2011-133622 A | 7/2011 |
| JP | 2012-123055 A | 6/2012 |
| JP | 2012529661 A | 11/2012 |
| WO | 2002/08826 A1 | 1/2002 |
| WO | 02/075443 A1 | 9/2002 |
| WO | WO 2006/085256 A1 | 8/2006 |
| WO | 2008/013501 A1 | 1/2008 |
| WO | 2010/075627 A1 | 7/2010 |
| WO | 2010/127204 A1 | 11/2010 |
| WO | 2010/142019 A1 | 12/2010 |
| WO | WO 2012/079159 A1 | 6/2012 |
| WO | WO 2013/044371 A1 | 4/2013 |
| WO | WO 2013/117847 A1 | 8/2013 |
| WO | WO 2013/177676 A1 | 12/2013 |
| WO | 2014/134714 A2 | 9/2014 |

OTHER PUBLICATIONS

International Search Report and Written Opinion, dated Aug. 27, 2014, for corresponding PCT Application No. PCT/CA2014/0000191.

USPTO Office Action dated Nov. 16, 2017 in co-pending U.S. Appl. No. 15/106,180.
Co-pending U.S. Appl. No. 14/773,698, filed Sep. 8, 2015; Gauthier, et al. now U.S. Pat. No. 9,810,963.
Extended European Search Report, dated Nov. 10, 2016, for European Application No. 14760038.1-1904 / /2965151.
USPTO Office Action dated Dec. 21, 2016 in co-pending U.S. Appl. No. 14/773,698.
Co-pending U.S. Appl. No. 15/698,257, filed Sep. 7, 2017; Gauthier, et al. now U.S. Pat. No. 10,684,525.
USPTO Office Action dated May 29, 2018 in co-pending U.S. Appl. No. 15/106,180.
USPTO Office Action dated Oct. 4, 2018 in co-pending U.S. Appl. No. 15/698,257.
USPTO Office Action dated Apr. 12, 2019 in co-pending U.S. Appl. No. 15/698,257.
USPTO Office Action dated Oct. 17, 2019 in co-pending U.S. Appl. No. 15/698,257.
Co-pending U.S. Appl. No. 16/867,831, filed May 6, 2020; Gauthier, et al. Now US Patent Publication No. 2021-0088868.
International Search Report and Written Opinion, dated Apr. 7, 2015, for corresponding PCT Application No. PCT/CA2014/051226, 11 pages.
Communication pursuant to Rules 161(2) and 162 EPC, dated Jul. 26, 2016, for corresponding European Application No. 14873054.2-1904, 2 pages.
Extended European Search Report, dated Jul. 19, 2017, for European Application No. 14873054.2-1914/3084519, 3 pages.
Second Office Action for Japanese Application No. 2016-540994 dated Jun. 11, 2019 in 8 pages.

* cited by examiner

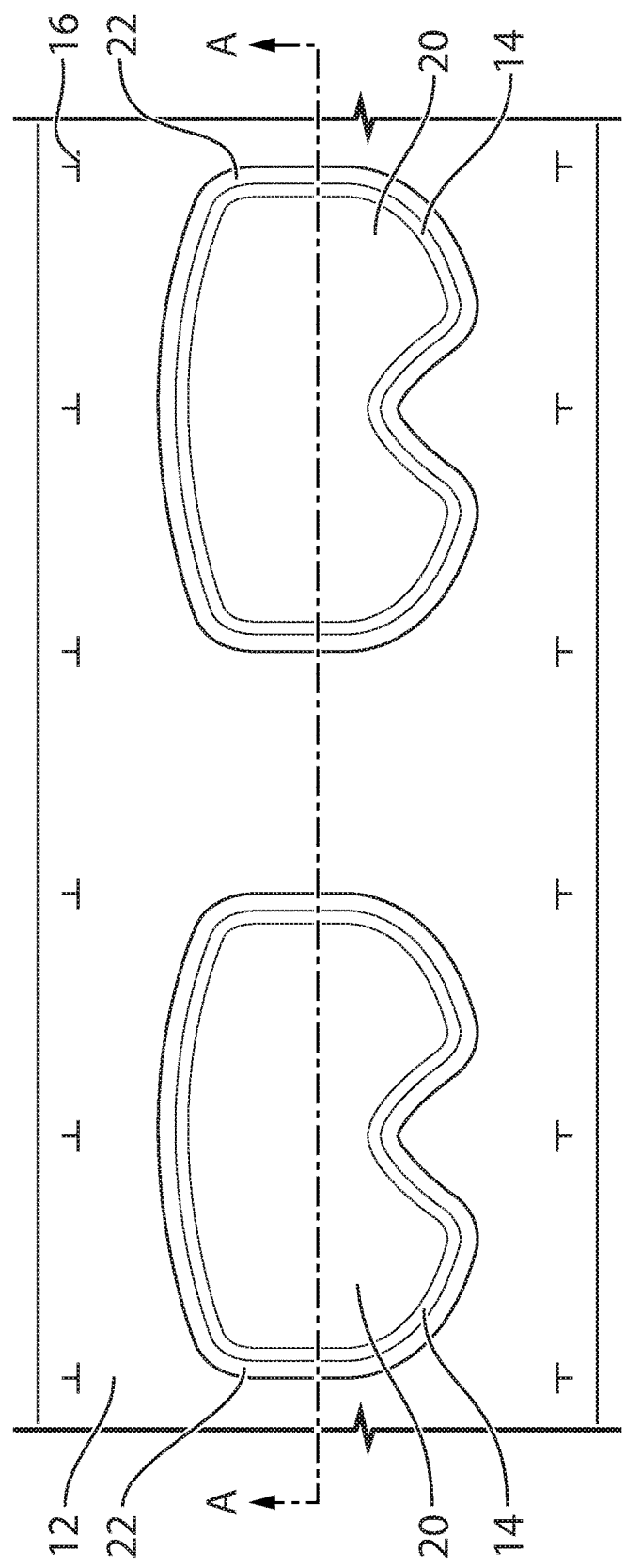
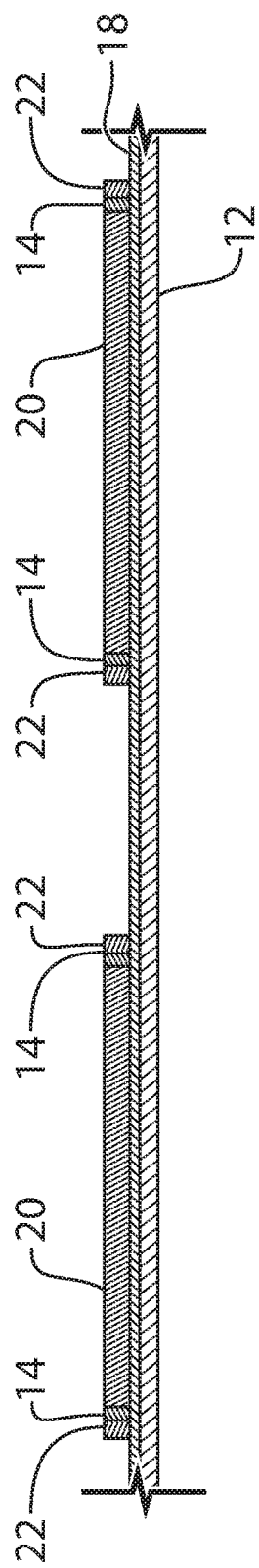

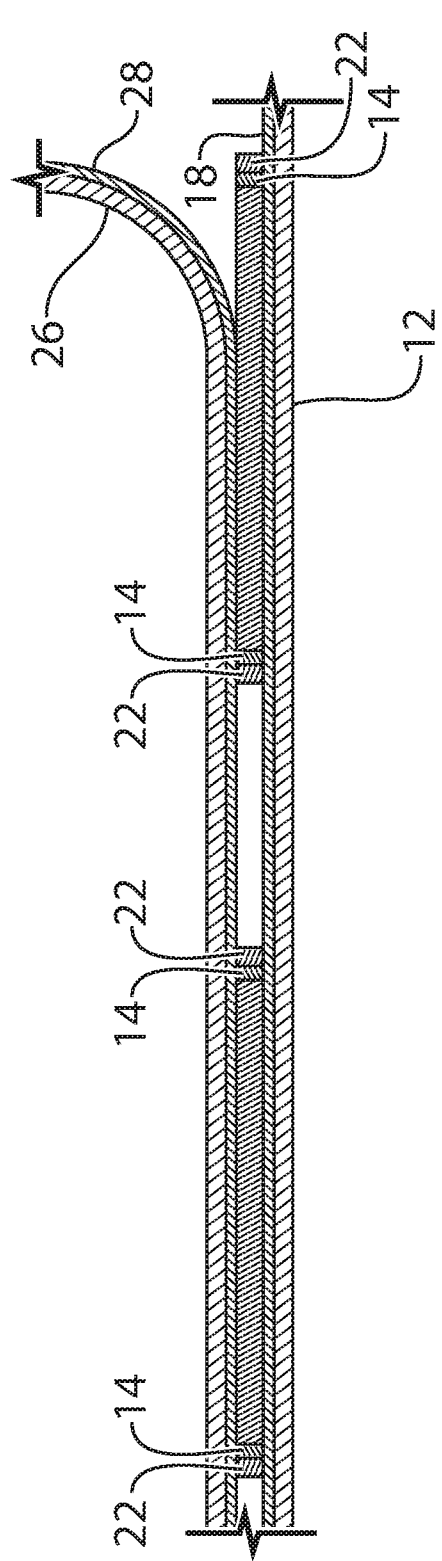

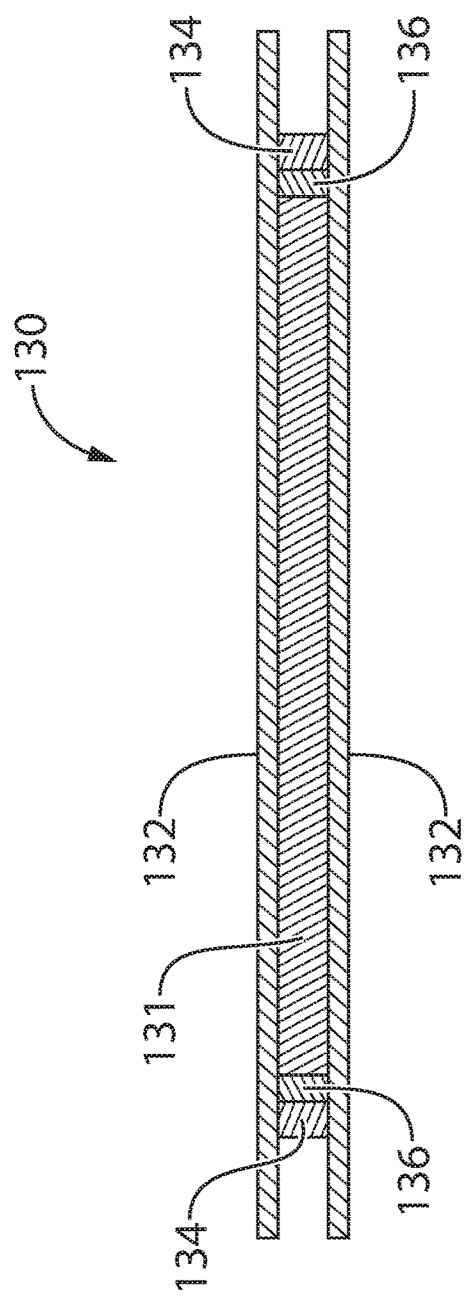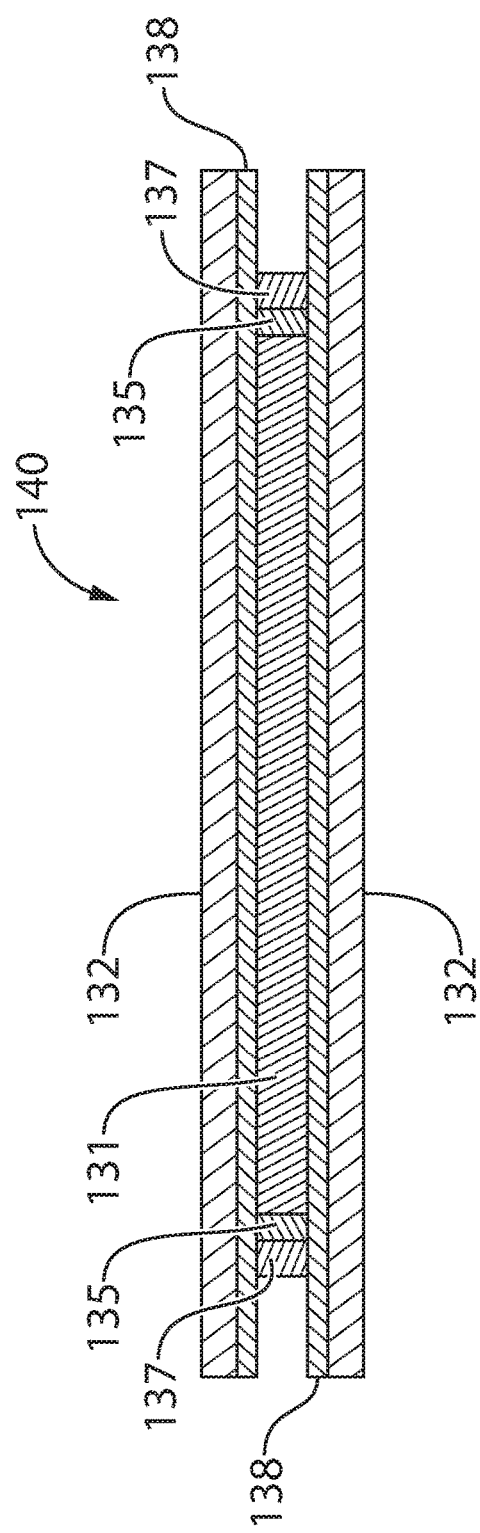

SWITCHABLE OBJECTS AND METHODS OF MANUFACTURE

This application is claims the benefit of U.S. Provisional Application No. 61/918,487 filed Dec. 19, 2013; and U.S. Provisional Application No. 61/949,093 filed Mar. 6, 2014; both of which are incorporated herein by reference in their entirety.

TECHNICAL FIELD

The present disclosure relates to methods of manufacture of switchable objects. More particularly, the methods include printing of one or more components of a switchable object.

BACKGROUND

Chromogenic materials may be formed into films or thin layers on suitable substrates, depending on the nature of the chromogenic material, and in some cases, its intended use. Some electrochromic materials may be coated or deposited on a glass substrate by sputter coating, chemical vapor deposition, or the like, while others may be dispersed into a pre-formed chamber. Some chromogenic systems may incorporate multiple functional layers for operation—separate chromogenic, electrolyte, electrode and ion-intercalating layers, for example. Such a multi-layered chromogenic system may be formed by sequential deposition of layers—the layers may be individually treated (e.g. dried, polymerized, cured or the like) before deposition of subsequent layers. For some configurations, prevention of mixing of adjacent layer components may be necessary, and removal of co-solvent or carrier solvents may be required before deposition of a subsequent layer. This may be made more difficult in continuous throughput systems, and increase the number of variables in the procedure.

Some chromogenic materials may be coated onto a moving web using roll coating, knife coating, extrusion or the like, forming a continuous sheet of the chromogenic material, which may be later cut to a desired shape While sheet-formed switchable materials may be cut successfully, the unused (weed) portions represent a waste of switchable material. Additionally, the exposed, cut edges of the switchable materials may be adversely affected by exposure to the ambient environment—loss of solvent phase, interaction of switchable material components with air/oxygen, for example.

Constructing a chamber with opposing substrates and a circumferential seal, and backfilling the chamber is one method used to introduce an electrochromic material into a device, but this necessitates fill port(s) and multiple steps of construction—the seal material is disposed and allowed to cure or set, before a sufficiently fluid electrochromic material is introduced. Such a device may be difficult or impossible to form or mold to a desired shape, thus the opposing substrates would need to be pre-shaped, adding further complexity to the manufacturing process.

SUMMARY

A method of manufacturing a switchable object using a high-throughput manufacturing process may be desirable. Reduction of handling, and simplification of the sealing process to contain the switchable material, and/or protect it from exposure to ambient environment may provide benefits in reduced cost of materials, reduced handling, faster throughput, fewer failed devices, or other improvements. Chromogenic systems employing a single layer of chromogenic material may be advantageous in this regard, and may lend themselves particularly well to continuous throughput methods. Chromogenic materials that are flowable and can be handled and dispersed in fluid form may lend themselves to deposition using high throughput printing methods such as screen printing.

The present disclosure relates to methods of manufacturing switchable objects.

In accordance with one aspect, there is provided a method of printing a switchable object comprising the steps of a) applying a switchable material on a first surface of a first substrate, the switchable material having a thickness and a shape; b) applying a barrier material on the first substrate, circumferential to the switchable material; and c) applying a second substrate over top of, and in contact with, the switchable material and the barrier material, the first substrate, second substrate and barrier material defining a closed chamber encapsulating the switchable material.

In accordance with another aspect, there is provided a method of making a switchable object comprising the steps of a) applying a barrier material on a first surface of a first substrate; b) applying a switchable material on the first surface, the switchable material having a thickness and a shape, and surrounded by the barrier material; and c) applying a second substrate over top of, and in contact with, the switchable material and the barrier material, the first substrate, second substrate and barrier material defining a closed chamber encapsulating the switchable material.

The method may further include a step b2 of applying a seal material on the first substrate, surrounding the barrier material.

The method may further include a step d of releasing the switchable object from surrounding substrate.

The method may further include a step e of cutting first and second bus-bar platforms comprising:
 i. performing a first kiss-cut on the first substrate, removing a portion of the first substrate to provide a first bus bar platform;
 ii. inverting the switchable object; and
 iii. performing a second kiss-cut on the second substrate, removing a portion of the second substrate to provide a second bus bar platform.

The method may further include a step of applying a bus bar material or an electrical lead to the first substrate, the second substrate, or both the first and the second substrate, alongside a portion of the switchable object.

In accordance with another aspect, there is provided a method of making a flexible, switchable object comprising providing a mask of a barrier material with a release liner defining a shape, the mask applied to a conductive surface of a first substrate; applying a layer of switchable material over the mask to fill the lens shape; and removing the excess switchable material.

The switchable material may be cured before removing excess switchable material; removal of the excess switchable material may be accomplished by removal of a relapse liner (removable layer). The switchable object may be a goggle lens.

In accordance with another aspect, there is provided a switchable object made according to a process comprising the steps of: a) applying a switchable material on a first surface of a first substrate, the switchable material having a thickness and a shape; b) applying a barrier material on the first substrate, circumferential to the switchable material; and c) applying a second substrate over top of, and in contact with, the switchable material and the barrier material, the first substrate, second substrate and barrier material defining a closed chamber encapsulating the switchable material. In accordance with another aspect, there is provided a switchable object made according to the process comprising the steps of a) applying a barrier material on a first surface of a first substrate; b) applying a switchable material on the first surface, the switchable material having a thickness and a shape, and surrounded by the barrier material; and c) applying a second substrate over top of, and in contact with, the switchable material and the barrier material, the first substrate, second substrate and barrier material defining a closed chamber encapsulating the switchable material.

In accordance with another aspect, there is provided a switchable object comprising: a first substrate comprising a transparent conductive coating, a portion of a switchable material, a portion of a barrier material surrounding the portion of switchable material, optionally a portion of seal material surrounding the portion of barrier material, and a second substrate comprising a transparent conductive coating; the transparent conductive coatings of the first and second substrates both in contact with the switchable material and the barrier material, and optionally the seal material. The first and second substrates with transparent conductive coating and the barrier material may define a closed space containing the switchable material.

In some aspects, the seal material and the barrier material are spaced apart. In some aspects, the first surface of the first substrate comprises a transparent conductive layer, the transparent conductive layer in contact with the switchable material. In some aspects, the second substrate comprises a transparent conductive layer, the transparent conductive layer in contact with the switchable material. In some aspects, the switchable object has a finished shape substantially similar to the applied switchable material. In some aspects, the shape of the switchable object may be a polygon. In some aspects, the shape of the switchable object may be lens-shaped or goggle-shaped.

The present disclosure also relates to a seal system for a switchable object. The seal system may further comprise a detection system for detecting a compromised seal component.

In accordance with another aspect, there is provided a seal system for a switchable object, the seal system comprising a barrier material and a seal material, the barrier material disposed along an edge of a switchable material, separating the switchable material from the seal material; the barrier material, seal material, or barrier material and seal material comprising an indicator material.

In some aspects, the seal system further comprises a trigger material.

In some aspects, the switchable material comprises an indicator material or a trigger material, or both an indicator material and a trigger material.

In some aspects, the barrier material comprises an indicator material and a trigger material.

In some aspects, the seal material comprises an indicator material and a trigger material.

In some aspects, the indicator material, trigger material or indicator material and trigger material may be encapsulated with an encapsulating material. The indicator material, trigger material or indicator material and trigger material may be encapsulated in layers.

This summary does not necessarily describe the entire scope of all aspects. Other aspects, features and advantages will become apparent to those of ordinary skill in the art upon review of the following description of specific embodiments.

BRIEF DESCRIPTION OF THE DRAWINGS

These and other features will become more apparent from the following description in which reference is made to the appended drawings wherein:

FIGS. 1A and 1B show components of a printed switchable object on a substrate, prior to application of a second substrate, according to one embodiment. A) top view of the printed substrate: B) sectional view along line A-A.

FIG. 2 shows a sectional view of a printed switchable object with partial application of a second substrate, according to another embodiment.

FIG. 8 shows a sectional diagram of a portion of a switchable object comprising an active layer and first and second seal materials, according to another embodiment.

FIG. 9 shows a sectional diagram of a portion of a switchable object comprising an active layer and indicator layers, according to another embodiment.

DETAILED DESCRIPTION

Figure 3A:
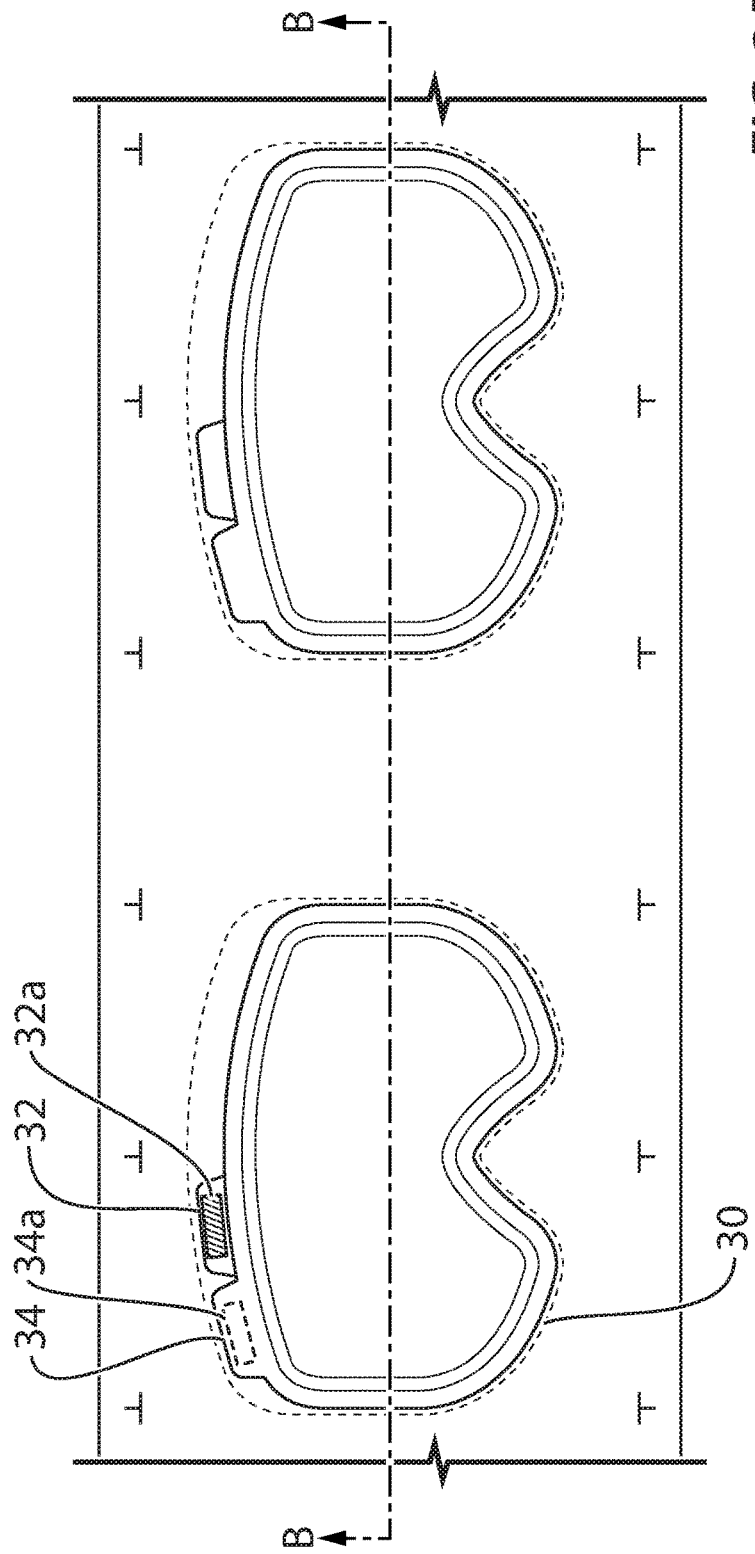
FIGS. 3A and 3B show components of a printed switchable object on a substrate, illustrating cut lines and position of bus bar platforms, according to another embodiment. A) top view of the printed substrate; B) sectional view along line B-B.

There is provided a method of making a switchable object comprising the steps of applying a barrier material on a first surface of a first substrate, and applying a switchable material on the first surface, the switchable material surrounded by the barrier material.

There is further provided a method of making a switchable object comprising the steps of applying a switchable material on a first surface of a first substrate, and applying a barrier material on the first substrate, circumferential to the switchable material.

There is further provided a method of making a switchable object comprising the steps of applying a switchable material on a first surface of a first substrate, and applying a seal material on the first substrate, the seal material surrounding the switchable material.

There is further provided a method of making a switchable object comprising the steps of applying a barrier material on a first surface of a first substrate, applying a seal material along at least a portion of the circumference of the barrier material; applying a switchable material on the first surface of the first substrate, inside a boundary of the barrier material and not in contact with the seal material.

There is further provided a method of making a switchable object comprising the steps of providing a mask of a barrier material defining a shape, applying the mask to a surface of a substrate; applying a layer of switchable material over the mask to fill the shape; and removing excess switchable material.

Any of these methods may further include a step of applying a second substrate over, and in contact with, one or more than one of the switching material, the barrier material and the seal material.

A switchable object may be a lens for an opthalmic device or a window for a building, vehicle, boat, aircraft or the like. Opthalmic devices may include eyeglasses, ski or sport goggles, sunglasses, visors, see-through shields or the like.

The switchable material, barrier material, seal material, and any other layer or pattern applied in the making of a switchable object may be die cut or kiss-cut and transferred to the substrate, or may be slot-die coated, extruded, sputtered, sprayed, screen printed, inkjet printed, stencil printed or the like. The choice of application method may depend on the characteristics of the specific material—viscosity, temperature response, adhesive properties, compatibility with other components used in the method. In an automated or semi-automated process, the components may be applied in any appropriate sequence, and in any suitable pattern. The one or more materials, layers or patterns may be dried, set or cured before a subsequent pattern is applied.

FIG. 1A shows a portion of a substrate 12 with a pattern of a barrier material 14, a switchable material 20 and a seal material 22 disposed thereon. The barrier material, seal material, or both barrier material and seal material may be continuous. In other embodiments, the barrier material, seal material or both barrier material and seal material may include one or more gaps or breaks to accommodate a fill port, a pass-through or via for an electrical connector or other conduit, or the like. Reference marks 16 may be included on the substrate to aid in positioning of printing apparatus, aid application of switchable object components, to guide cutting of the materials, aid alignment of other components of a switchable object, or the like. In this embodiment, reference marks are shown along the edges of the substrate, however they may be positioned elsewhere as appropriate, or omitted entirely in some embodiments. FIG. 1B shows a sectional view of FIG. 1A, along the line A-A. Substrate 12 includes a transparent conductive layer 18 disposed on the first surface of the substrate. In some embodiments, a pattern of conductive bus bar material may be applied alongside a portion of the seal material. The transparent conductive coating may be a component of the substrate as supplied, or the transparent conductive coating may be applied in a step in advance of application of the switchable material, barrier and/or seal, as part of the process.

The order of deposition of the barrier material, switchable material and seal material may be varied. For example, a barrier material may be applied first, and allowed to set or cure if necessary or desirable, the barrier material defining a space, or area, to contain a switchable material. The barrier material may be printed, or may be die-cut or kiss-cut from a sheet material in a defined shape, and the cut shape transferred to the first substrate. The switchable material may be applied, and may be allowed to set or cure, fully or partially. The switchable material may be a fluid. In other embodiments, the switchable material may be cut from a sheet material in a defined shape. The barrier material, switchable material or both may retain some tack after applying, to aid in adherence of the second substrate that may be applied later. A seal material may be applied around the outline of the barrier material, and allowed to set or cure, retaining some tack, again to aid in adherence of the second substrate. The pattern of switchable material and pattern of barrier material may have a small gap therebetween, or may be in contact, but may not overlap. The pattern of seal material and barrier material may have a small gap therebetween, or may be in contact, but may not overlap.

After deposition of the switchable material, barrier material and/or seal material, a second substrate 26 is applied (FIG. 2), contacting the switchable material, barrier material and/or seal material, and passed through a nip roller to ensure even contact. The second substrate 26 comprises a transparent conductive layer 28. The first and second substrates and barrier material together form a sealed space encapsulating the switchable material. The seal material may be applied in sufficient quantity to compress and flow around the barrier material to complete the seal and isolation of the switchable material from the external environment, and prevent leakage. Where the seal material is applied to leave a gap between the seal and barrier, passing through the nip roller may apply sufficient pressure to squeeze seal material into the gap. Optionally, a support material (not shown) may be applied over a portion of the unprinted area of the first substrate before application of the second substrate, to provide mechanical support of the second substrate and prevent uneven pressing of the nip roller or compression when the film is wound up on an uptake roller.

Once the second substrate has been applied, the film may be wound up on a roll and stored, or held to allow curing of the components, if desired. Alternately, the switchable objects may be cut from the weed material, and then allowed to cure.

A stencil or a mask may be used to apply the switchable material (a switchable material infill) to the substrate in a desired shape. The mask may be a removable and repositionable component separate from the switchable object (akin to a screen on a screen-printing machine) that is held in position while the switchable material is applied. Alternately, the mask may be a film (e.g. plastic sheet or layer, such as polyethylene terephthalate (PET) or other suitable material) adhered to or placed over the conductive substrate. The mask may form part of the final seal system (e.g. a barrier or seal material), or it could be removed prior to application of the seal system components. The film may be cut into the desired shape with a space where the switchable material is to be coated when positioned on a substrate. For embodiments where the mask is adhered to the substrate, a low-tack adhesive may be used to minimize disruption of any conductive layers or coatings on the substrate. Once the switchable material infill is applied and allowed to cure or set, the mask may be removed, taking with it any overflow or excess switchable material, and leaving the shaped switchable material on the first substrate.

To provide the barrier material surrounding the switchable material, a layer of barrier material may be applied to a second substrate comprising a transparent conductive layer, and a corresponding mask shape kiss cut with a laser to provide the space to accommodate the switchable material. Once the switchable material is cured or set and the mask removed, the opening cut in the barrier material and switchable material infill are aligned, with the switchable material making contact with a transparent conductive layer of the second substrate, and the barrier material making contact with a transparent conductive layer of the first substrate. The resulting "sandwich" is pressed together to seal the substrates to the barrier material, enclosing the switchable material. Registration marks may be placed on either or both substrates to aid in alignment. Pressure may be applied with a manual roller, a nip roller, or other suitable means. The alignment could be done manually, or by optical alignment of two roll-to-roll webs for a continuous manufacturing process. If prepared manually (e.g. for making individual prototypes), the two substrates may be aligned and held in place with tape or adhesive to allow one of the substrates to hinge up for coating while still maintaining relative alignment between the top and bottom substrates.

In another embodiment, a frame of barrier material or seal material may be cut to provide a mask with a cutout region of the size and shape of the switchable area of the switchable object. The mask is applied to a first surface of a substrate comprising a transparent conductive layer; the other side of the mask (exposed side) not in contact with the first substrate is covered by a release liner. The barrier or seal material may adhere to the substrate, or an additional adhesive may be used to secure the mask. Switchable material is applied over the mask, filling in the cutout region.

Once the switchable material is applied, the release liner remaining on the barrier material mask is removed, taking with it any overflow or excess switchable material outside the cutout area. The mask may be removed while the switchable material is still flowable, or after setting, drying or curing, or at an intermediary stage. Timing of removal of the mask may be selected to avoid disturbance of the switchable material in the cutout region, and/or to provide a clean edge, or to facilitate manufacturing requirements. In some embodiments, the mask may be removed immediately after application of the switchable material. In some embodiments, the mask is kept in place while the switchable material is dried. Following removal of the release liner, a second substrate comprising a transparent conductive layer may be applied, contacting both the switchable material and the barrier material, and encapsulating the switchable material.

The mask may be part of a sheet of material with one or more shapes cut and arranged in a pattern. The shapes may be same or different. In other embodiments, the mask may comprise a strip of barrier material, the ends joined to form a continuous strip defining the size and shape of the switchable area. The material may be cut using any suitable cutting device or method, for example die cut, scissors, knife, laser cut or the like.

Employing a method where the barrier material also acts as the 'mask' to shape the switchable material, and overflow switching material is then removed may be advantageous, in that register marks are not needed to position the mask and switchable material components separately, thus simplifying manufacture. Selecting the thicknesses of the barrier material mask and the release liner in order to achieve the proper wet and dry thicknesses of the switchable material may be helpful. The mask thickness may be selected to match the final desired thickness of the switchable material, to avoid leaving gaps when the second substrate is applied. The switchable material, when applied, may be about flush with the top surface of the mask, or flush with the top surface of the removable layer, or may overflow, and excess material removed with a squeegee or blade, or lifted off when the removable layer is lifted. The switchable material may decrease in thickness as it dries, so that it retreats below the level of the removable layer and becomes about flush with the top surface of the mask. The thickness of the mask and removable layer may be any suitable thickness, each independently from about 10 microns to about 100 microns or any range or amount therebetween. In some embodiments, the removable layer may be about the same thickness as the mask, in some embodiments, The removable layer may be about twice, to about 10 fold the thickness of the mask, and the amount by which the thickness of the switchable material decreases may be dependent on the drying conditions and the composition of the switchable material. In some embodiments, the switchable material may comprise a substantial portion of a removable (sacrificial) co-solvent that is included to facilitate handling and printing, but removed before the second substrate is applied. For example, the thickness of the barrier material mask may be is about 1 mil (about 25 microns), and the thickness of the release liner may be about 2 mil (about 50 microns). Applying a wet coating with a thickness of about 3 mil (about 75 microns) that dries to a thickness of about 1 mil (about 25 micron). Other thicknesses may be chosen depending on the optical and performance (e.g., switching speed) properties desired for the optical film.

Figure 3B:
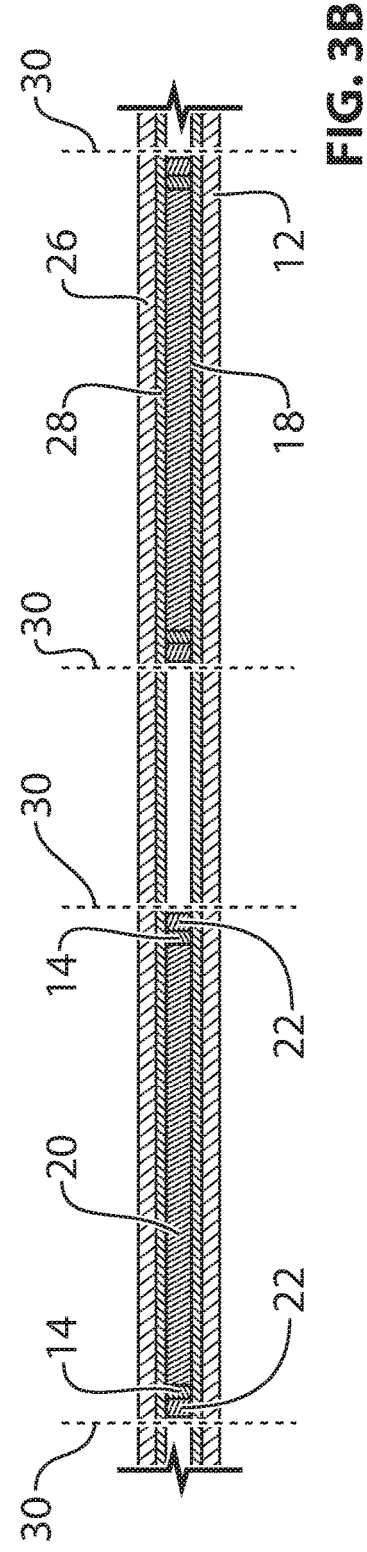

Referring to FIGS. 3A and 3B, another embodiment is shown. The switchable objects (in this embodiment, lens for a ski goggle) may be cut from the continuous web of material along cut line 30 to release the object. Tabs 32, 34 may be kiss-cut expose the transparent conductive layer of the substrate and provide bus bar platforms or electrical lead attachment points 32*a*, 34*a*. Release of the switchable object may be done as part of a continuous process or as a batch process after the components have been cured. Cutting may be done using a laser cutter, a blade, a punch die or other suitable cutting method. Cut line 30 may pass through the outer edge of the seal material to provide a sharp edge and prevent the transparent conductive layers from contacting and forming an electrical short. By making the cut through the outer edge of the seal, the pressure applied to initiate the cut (where mechanical cutting is employed) may compress the seal material, and not the switchable material itself, thus preventing compression of the switchable material, distorting or displacing the layer of switchable material and facilitating undesired contact between the transparent conductive layers on the substrates. This contact would create an electrical short when electricity is applied to the switchable object, and the switchable object may not switch uniformly, or at all. Use of a laser cutter for this cut avoids the application of force to the material when cutting. The transparent conductive coating may be brittle, and may release shards of conductive material when cut, which may contact the opposing conductive material and cause a short. By making the cut through the seal material, any stray shards that might form are held by the seal material, away from the opposite conductive layer.

Figure 5:
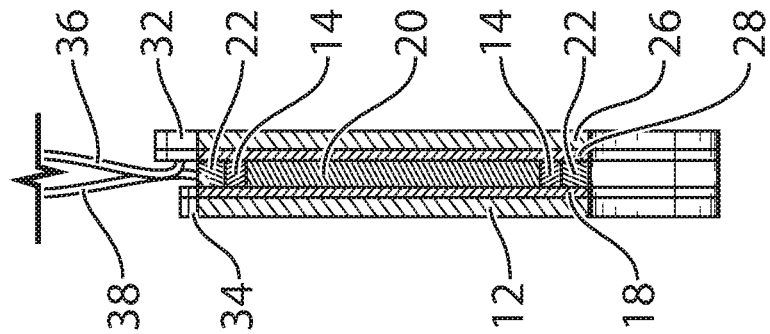
FIG. 5 shows a sectional view of the embodiment according to FIG. 4, along line C-C.
Figure 4:
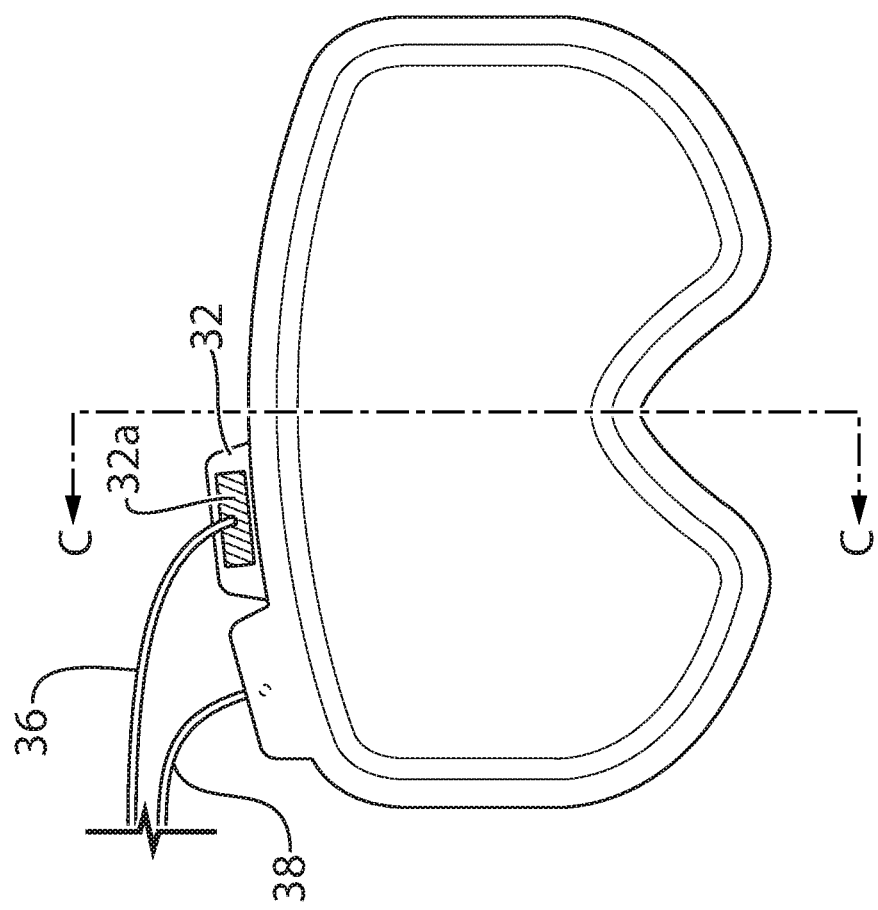
FIG. 4 shows a switchable article cut from the web, with kiss-cut tabs, according to another embodiment.

To form the bus bar platform (electrical lead attachment point) 32*a*, tab 32 is kiss cut to remove a portion of the second substrate, leaving the first substrate and the transparent conductive layer intact (FIGS. 4, 5). To form bus bar platform 34*a*, tab 34 is kiss cut similarly to that for 32*a*, removing a portion of the first substrate, leaving the second substrate and transparent conductive layer intact. The object may be inverted after kiss cutting of tab 32 to facilitate kiss cutting of tab 34. Bus bar material may be applied to the bus bar platforms 32*a*, 34*a*, and electrical leads 36, 38 affixed to the bus bar material (FIGS. 4, 5). Bus bar material may include conductive adhesives, conductive inks or the like. Electrical connectors 36, 38 may be of any suitable material and may be affixed to the bus bar by any suitable methods, including adhesion (conductive adhesive or conductive epoxy), soldering, clips, rivets or the like. Suitable material for electrical connectors may include conductive tape, wire, copper tape (e.g. Kapton™) or the like.

To make a kiss cut using a laser cutter, a laser may be configured to cut only through the upper most substrate and conductive coating, without cutting through or damaging the conductive coating of the lower substrate. The penetrative power of the laser when cutting through the upper substrate may be absorbed or dissipated to below a threshold level.

The penetrative power of the laser may be a product of the laser power (wattage), the type or source of the laser, whether the laser is a continuous or a pulsed beam, duration of the pulses, and the rate at which the laser is moved across the surface to be cut. In some embodiments, the laser may be a $CO_2$ laser; in some embodiments, the laser power may be from about 0.1 to about 5 W or any amount or range therebetween, or from about 0.5 to about 2 W, or any amount or range therebetween; in some embodiments, the laser may be pulsed at an interval of from 500 to about 2000 pulses per inch (PPI) (about 200 to about 800 pulses per centimeter) or any amount or range therebetween, or from about 1200 to about 1800 PPI (about 475 to about 700 pulses per centimeter) or any amount or range therebetween or from about 1400 to about 1600 PPI (about 550 to about 640 pulses per centimeter) or any amount or range therebetween. In some embodiments the laser radiation may have a frequency of from about 9 microns to about 11 microns (1 micron=0.001 millimeter) or any amount or range therebetween. Laser cutting may be performed under a nitrogen blanket. Pulsing the laser allows application of a substantially consistent amount of energy along a cutline; if insufficient energy is applied to make the cut, the weed portion may not separate cleanly and shorting may result.

Forming the bus bar platforms (32, 34) or electrical lead attachment points (32a, 34a) outside of the region where the seal, barrier and switchable material has been printed avoids the need to remove any switchable material from the bus bar platform. Where the object 'blanks' are cut from a continuous sheet of switchable material, the barrier and seal are applied after cutting, and a bus bar platform formed by a kiss cut may need to have the switchable material removed before applying a bus bar. While the cutting of blanks may be quicker than printing the components, the subsequent handling steps to kiss cut the bus bars, clean the switchable material and apply the barrier and seal may require substantially more handling. By printing the components of the switchable object (switchable material, barrier and seal), an overall higher throughput, with greater consistency may be achieved.

The switchable object (a goggle lens for this example) may be laminated to, or between, layers of plastic, or may be incorporated into an injection-molded polycarbonate lens using film-in-mold injection molding. Notably, the transparent conductive layers ("electrodes") of the first and second substrates are kept separated by the switchable material—no spacers are needed. Thus, the switchable object may be described as "spacerless".

In another embodiment, once the film is cut to shape with the barrier material and optionally bus bars and electrical connectors in place, a secondary seal may be applied. Secondary seal is applied around the perimeter of the barrier material. in some embodiments, additional plastic (e.g. PET) film layers are positioned to 'sandwich' the switchable object and may be held in position using an adhesive. A seal material may be injected into the space between the two additional plastic layers, adjacent to the barrier material. The seal material may aid in preventing ingress of oxygen, moisture or other materials, and may aid in providing additional mechanical strength and adhesion of the switchable object layers and components. A seal system useful for such a switchable object is described in PCT Publication WO2014/134714, incorporated herein by reference.

The above-referenced techniques and embodiments may be scaled up and/or automated, or partially automated, for mass manufacturing. For example, roll-to-roll converting equipment can be used to mass manufacture a product such as a ski goggle or other eyewear lens. In such an example, roll-to-roll film converting machinery can be used to prepare the base substrate with the barrier material and release-liner already adhered to it. The coating can then be applied using slot die, rotary screen print, knife coating, or any number of methods, and the mask removed as part of the roll-to-roll process. Optical alignment can be used to align the coating to the mask, if required, and it can also be used to align the top substrate with the bottom substrate if needed. The film can then be run through a dryer to remove the sacrificial solvent and the top conductive substrate laminated down also in a continuous roll-to-roll process. Cutting to the final shape and applying secondary seals can also be done in a roll-to-roll manner using automated machinery.

Similar methods may be used for large-format applications such as automotive sunroofs and architectural windows. For large-format applications, the mask can be first laid down on the first conductive substrate either as a pre-formed or pre-cut barrier material (e.g. butyl rubber tape) with a release liner, a temporary mask that is to be peeled off, or a dispensed seal that is covered with a liner that is to be peeled off. The whole substrate can then be coated over. In the case of a large-area application, using a slot-die coating method can provide for better coating uniformity than using a squeegee or a knife coating, which may be advantageous even if there is some waste from coating over the mask.

Figure 6:
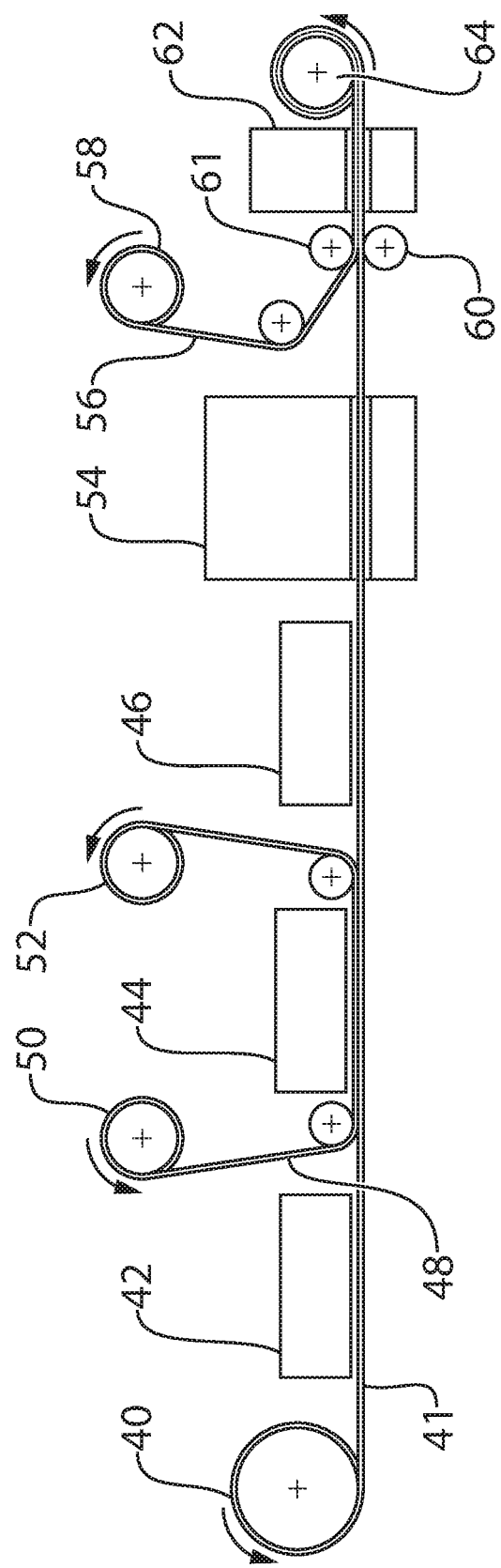
FIG. 6 shows a schematic diagram of a manufacturing process, according to another embodiment.

FIG. 6 shows a schematic diagram of a manufacturing line for a printed switchable object. Substrate 41 is unwound from roll 40, and printing station 42 applies a barrier material. Printing station 44 applies a switchable material, and printing station 46 applies a seal material. Optionally, a release liner 48 to prevent sticking of the printing screen to printed layers may be employed. Release liner 48 may be dispensed from roll 50, and wound up on roll 52. The order of the print stations may be varied, and one or more of the print stations may employ screen printing, ink-jet printing, a transfer process, an XY deposition process (e.g. an extruded pattern) of one of the components or the like. After application, the moving web (substrate) may be fed through a dryer 54 to set or cure the applied materials, or evaporate a solvent used in the process that is not intended to be left behind. A second substrate 56 is unwound from roll 58 and adhered to the printed switchable objects using nip rollers 60, 61. The film may proceed for further curing 62 (e.g. UV exposure, heat), before being taken up on roll 64.

In some embodiments, the manufacturing line may include one or more additional drying stages, following printing of each component. In some embodiments, the dryer 54 may precede the step of application of the seal material, so that the seal material remains tacky to facilitate good adhesion of the second substrate 56 when passed through the nip rollers.

In some embodiments, the cured film with a plurality of switchable objects may be cut and the weed portion removed, and the cut objects kiss cut as described. Application of bus bars following kiss cutting, and/or application of electrical leads may be performed manually, or in an automated fashion.

The switchable material may be applied in any suitable shape. In the examples illustrated, the shape is a single goggle lens, however this is illustrative and not intended to be limiting. For example, a switchable object may be printed with a polygon shape suitable for a window, such as a window for a vehicle—e.g. a triangular window (e.g. a rear quarter window), a rectangular or trapezoidal shape for a vehicle side window, rear window or sunroof, or the like.

Some windows may move (e.g. up or down for side windows, laterally for a sunroof), and inclusion of tabbed bus bar platforms enables location of the bus bars along one edge or portion of the window—electrical leads can follow a common path from a power source (as opposed to a design where the bus bars are on opposite sides of the window or lens), and where it is desirable to exclude the bus bars from view for esthetic purposes, there is only one side of the window that may need substantive coverage, and leaving the others substantially unobstructed.

Figure 7A:
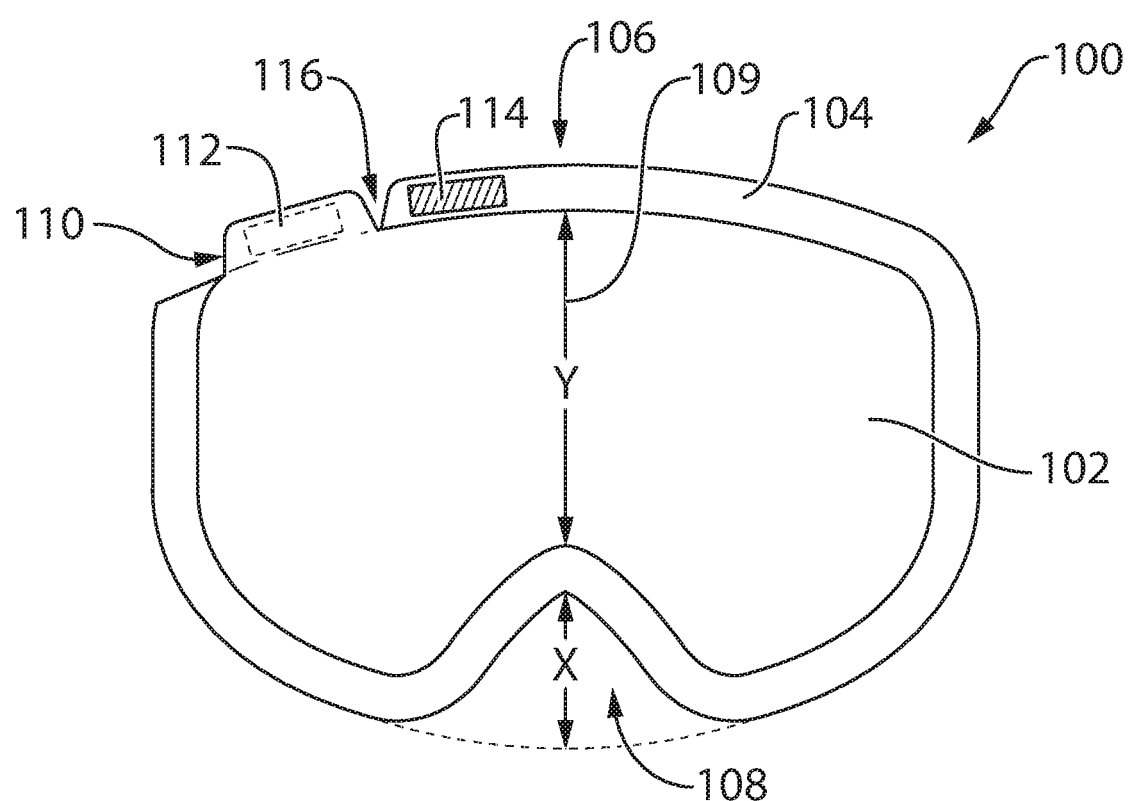
FIGS. 7A and 7B show schematic diagrams of a switchable object, according to another embodiment.

Referring to FIG. 7A, an apparatus according to another embodiment is shown generally at 100. Switchable object 100 is made in a goggle shaped lens suitable for use as, or with, a goggle lens or similar opthalmic device, and the substrates cut to a suitable shape with offset bus bar platforms. The lens 100 has an arc-shaped upper edge 106 and a lower edge with a cutout section 108 of height X for accommodating a user's nose, between lobed sections to cover the eyes of a user. The lens 100 may have a nose bridge section 109 of height Y, with an overall depth of the switchable area (from an upper edge to a bottom edge of the lens, inside the circumferential offset edges) of X+Y. The lens may be of unitary construction. As per other embodiments of switchable objects, switchable object 100 comprises a layer of switching material (not shown) disposed between first substrate 102 and second substrate 104. First and second substrates have interior sides facing each other, and exterior sides facing away. The interior side of one or both substrates has a transparent conductive layer in contact with the layer of switching material. First substrate 102 is cut to have a smaller perimeter relative to substrate 104, providing a recessed section along a portion of the perimeter. An overhanging tab 110 provides a platform for mounting a bus bar 112 on the interior side of substrate 102, in contact with the transparent conductive layer on the interior side of substrate 102. Substrate 104 has a recessed section corresponding to overhanging tab 110. Bus bar 114 is mounted on the interior side of substrate 104, along a portion of an edge of substrate 104, and in contact with a conductive transparent layer on the interior side of substrate 104. Gap 116 separates the cut sections of substrates 102 and 104, providing non-overlapping mounting points for bus bars 112, 114. Electrical connectors (not shown) may be mounted to bus bars 112, 114 to connect the lens to a source of power to facilitate electrochromic switching of the lens.

Lens 100 may be shaped to a cylindrical, spherical or frusto-conical configuration, and affixed to a frame using attachment points along a portion of the edge (not shown) or in a frame surrounding the periphery of the lens. Lens 100 may be thermoformed to conform to a spherical, or partially spherical lens shape. Lens 100, once shaped, may be laminated to a static plastic or glass opthalmic device using heat (melt lamination), or a heat or pressure activated adhesive, or combination thereof. In some embodiments, substrates 102, 104 may be rigid, or partially flexible plastic that may be formed into a suitable cylindrical, frusto-conical, spherical or partially spherical lens shape, and used in an opthalmic device without a second static glass or plastic lens.

Decreasing the depth of the nose bridge may generally increase the depth of the cutout section, making the first and second lobes of the lens more pronounced. By altering the height of the nose bridge and cutoff relative to each other (shifting the ratio X:Y), a lens with more or less flexibility about the nose bridge, a flatter profile, or more prominent profile may be formed.

The ratio of X:Y may be from about 1:10 to about 10:1 or any ratio therebetween, and may be selected according to the desired profile and shape of the lens. For example Y may be any percentage of the depth of the lens X+Y; Y may be from about 5% of X+Y to about 95% of X+Y, or any amount therebetween, for example about 10, 15, 20, 25, 30, 35, 40, 45, 50, 55, 60, 65, 70, 75, 80, 85 or 90%, or any amount or range therebetween.

For example, a lens for a ski goggle may have an X:Y ratio of from about 1:5 to about 1:1, whereas a unitary lens for sunglasses may have a smaller nose bridge, with an X:Y ratio of about 1:1 to about 5:1. It is appreciated however, that any suitable X:Y ratio may be used for ski goggles, sunglasses or any other type of unitary lens, without limitation.

Figure 7B:
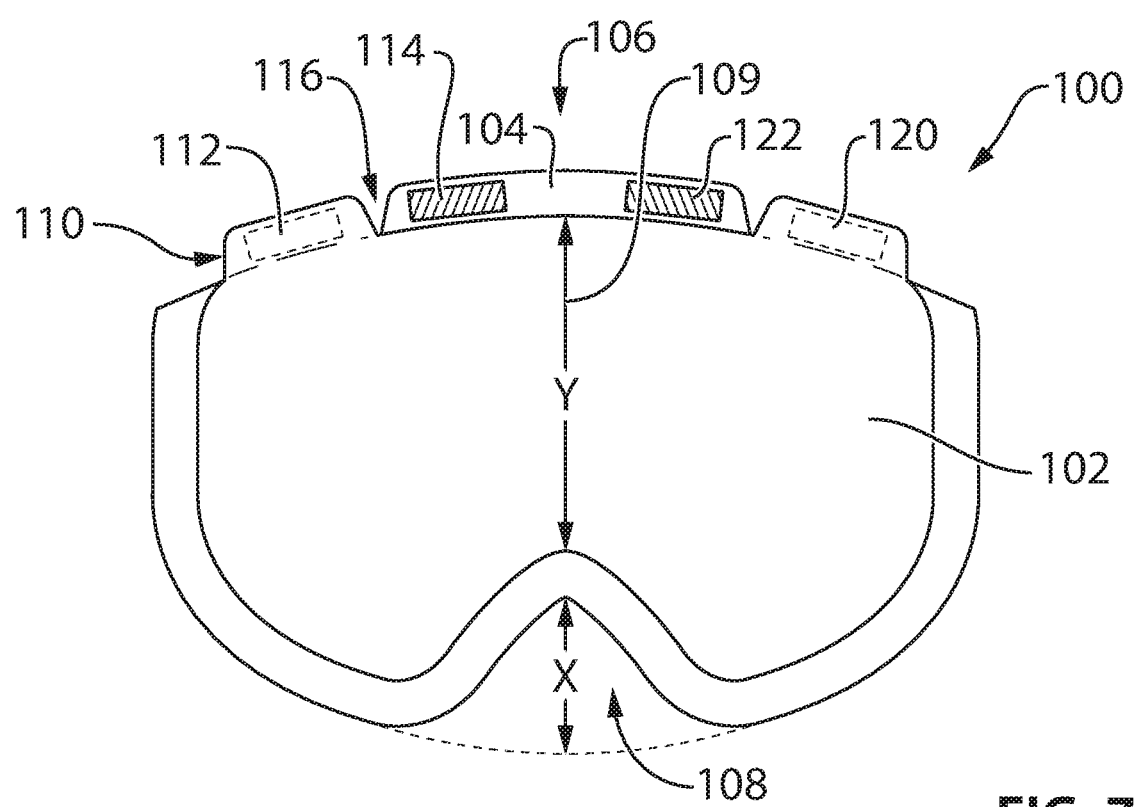

To electrochemically switch a lens according to some embodiments, an electrical potential is applied to the electrodes of the film 100 via bus bars 112, 114, and the switching material switches. The relationship between the height of the nose bridge Y, and the area of the lens may, in part, impact the speed of the switch of the lens. Without wishing to be bound by theory, resistivity of the electrode may increase as the nose bridge decreases (Y is reduced and X increased). In some embodiments, a second pair of bus bars 120, 122 may be included (FIG. 7B), with the electrical potential being applied to both pairs of bus bars simultaneously. For large area lenses or lenses with a smaller nose bridge (e.g. where X:Y is from about 1:1, 2:1, 3:1, 4:1, or the like), inclusion of first and second pairs of bus bars may allow for a faster switch.

Printing of the components of the switchable object allows for freedom of shape and configuration choice. A default ribbon shape of a slot die, extruder or roll coating methodology is not a limit to manufacturing. Spacing of the printed patterns may be configured to maximize the number of objects printed; alternately, more generous spacing between the printed objects may be employed, to reduce the demand of precision in alignment of the second substrate, or of cutting between the printed objects, or to reduce the area to be masked by a release line or other material to prevent inadvertent contact of a printed area with a component of the printing line.

Where the printing method is screen printing, one or more screens may be prepared with a photo-imaging polymer material to provide a stencil for application of the printing material in the desired pattern. The printing material (switchable material, barrier material, bus bar material, seal material or the like as addressed herein) is applied across the stencil, and the printing material forced (e.g. with a fill blade, squeegee or wiper, or pumped under suitable pressure) through the screen and onto the substrate. The printed switchable material may be cured, dried or allowed to set before application of a second printing material; alternately, the printing materials may be applied 'wet on wet', without a step of drying or curing between. For such an embodiment, the printing materials may need to be physically separated, and a release liner or mask used to prevent disturbing the first applied printing material.

Screen printing may be particularly suitable for application of switchable materials, as the rate of transition between dark and faded states, and the light transmissivity achieved in dark or faded states may be influenced in part by the thickness of the switchable material. The thickness of the screen mesh may be selected to ensure a suitably thick, and consistent, layer of switchable material is applied to the substrate. Viscosity of a switchable material may be manipulated by increasing or decreasing the polymer content, the proportion of col-solvent that may be used in application, the pot life of the material, temperature, or a combination thereof.

Screen printing presses may be flat-bed, rotary or cylinder; flat-bed or cylinder printing may be suitable for printing bus bars, for example, while a rotary screen press may be better suited for printing a continuous pattern, such as that of the switchable material, barrier material or seal material as addressed herein.

Switchable material for printing may be supplied to the stencil pattern for printing using a gravity feed, or, for a material with substantive viscosity, and/or a thick screen mesh (to provide a suitably thick pattern) with a pressurized nozzle or slot-die. A pump may supply a metered amount of printing material, or may be a pressure-metered pump, altering the applied pressure according to the positioning of the open or blocked region of the stencil, preventing uneven application of printing material.

The switchable material may be applied with a squeegee, a bar as with knife coating, or by slot-die coating. If a squeegee or a bar is used that is located to scrape across the top of the mask, minimal formulation will be coated on top of the mask. However, if a slot die is used the thickness of the coating deposited on top of the conductive substrate may be similar to the thickness of the coating deposited on top of the mask. With slot-die coating, the thickness of the applied material may be manipulated by any of several mechanical aspects of the coating process, web speed, flow rate of the coated material, and parameters of the slot die itself, including width, die-shim gap and die-substrate gap. With slot-die coating, the configuration of the mask should be low-profile, so as not to disrupt the bead of switchable material being laid down on the substrate.

Maintaining a minimal gap between the coating bar and the mask can be advantageous because it results in less waste of the switchable material, as minimal material is deposited on top of the mask. In some embodiments, the thickness of the mask should be carefully chosen because the mask thickness determines the thickness of the coating. As such, the mask should be sized to provide the desired wet coating thickness. In one example, the formulation comprises approximately 66% of a solvent such as THF that is evaporated from the formulation during drying. The formulation is coated at about 0.003 inch (about 76 microns) thick, and is dried down to the desired final thickness of 0.001 inch (about 25 microns). (one micron=0.001 millimeter)

Switchable material may be applied at any suitable thickness—as indicated above, the thickness of the mask may be a guide for the thickness of the switchable material to be applied. The thickness of the switching material will affect the transmittance of the switchable object, and can be adjusted depending on the particular application desired. In some embodiments, the switchable material may be between about 0.1 to about 50 microns thick, or from about 0.1 to about 10 microns thick, or about 0.5 to about 5 microns thick.

A seal system (comprising a barrier material, a seal material or barrier material and seal material) prevents ingress of matter that may affect performance of the switchable material. Where a switchable material is self-supporting, support or separation devices such as spacers, beads, dividers or the like are not needed in the seal system components. Where the switchable material is to be laminated between rigid substrates (e.g. using heat and pressure such as for a laminated glass), it may be advantageous to use seal system components that are compressible, to prevent breakage of the glass during lamination.

In some embodiments, the barrier material is a temporary barrier, separating the switchable material from a seal material. The barrier may swell or absorb plasticizer or other component from the switchable material (in a sufficiently small amount so as to not detrimentally affect the operation of the switchable material). For such embodiments, the barrier may also be unreactive with the seal material. The seal material may be reactive with the switchable material in an uncured, but not a cured state. The seal material may be sufficiently fast curing so as to complete the curing process before components of the switchable material swell and migrate through the barrier material.

In some embodiments, one or more of the seal system components may swell; swelling may occur during curing (for seal or barrier materials that are cured), or may swell after installation by absorption of a component of the switchable material. For some embodiments, this may be advantageous in instilling the seal system component into small gaps or separations.

In some embodiments, a mask may be formed from a sheet or strip of barrier material or seal material, and applied to a first substrate. One or more surfaces of the barrier material or seal material may be covered by a release liner to prevent contact with other components or reagents until it is desirable to expose the surface. Switching material may be screen-printed over the mask cutout and over the barrier material covered by release liner in a single application with a squeegee, coating knife, air blade slot die or other suitable methods, and the release liner removed, taking any overflow switchable material with it, to provide the switchable material framed by the barrier material or seal material. Further cutting steps may be employed to remove excess barrier material and/or seal material to provide the desired shape.

Seal system components may be a thermoplastic, a thermoset, a rubber, a polymer or metal, a metallized tape, or combinations thereof. A component may be selected to provide good adhesion to contacted surfaces (substrate, conductive layer, electrode, switchable material, electrical connectors or the like), and to provide suitable flexibility, barrier properties, mechanical durability and adhesion at the operating temperature of the switchable layer to maintain the isolation of the switchable material—for example, a seal system component may be selected that does not crack or crumble, break down, or lose adhesion as the temperature changes. A seal system component may not interact with the switchable material, or poison or interfere with the photochemistry and electrochemical performance of the switchable material. A seal system component may be electrically insulating. A seal system component may be gas-impermeable. A seal system component may be resistant to water, or may be water impermeable. A seal system component may comprise a desiccant to scavenge any residual water that may be present. Examples of desiccants include zeolites, activated alumina, silica gel, calcium sulfate, calcium chloride, calcium bromide and lithium chloride, alkaline earth oxide, potassium carbonate, copper sulfate, zinc chloride or zinc bromide. A desiccant may be dispersed in a seal system component, or applied to a surface of a seal system component.

In another embodiment, the seal system may comprise one or more indicators for indicating a deficiency in the first seal, the second seal, or both the first seal and the second seal. A breach or other deficiency in a seal may result in a product comprising a switchable material that is less durable, or potentially adversely affected by the external environment.

Referring to FIG. 8, a schematic diagram of a switchable film with first and second seals is shown generally at 130. Active layer 131 is disposed between substrates 132. Active layer 131 may comprise a switchable material. Substrate 132 may include a conductive layer (not shown). In one embodiment, active layer 131 comprises an indicator material and second seal 134 comprises a trigger material. In another embodiment, active layer 131 comprises a trigger material and second seal 134 comprises an indicator material. Where first seal (barrier material) 136 fails, interaction of the indicator material and trigger material may be permitted, and a detectable change occurs.

In another embodiment, first seal (barrier material) 136 comprises an indicator material, and a trigger material is a component of the external environment. Where the second seal 134 fails, interaction of the indicator material and trigger material is permitted, and a detectable change occurs.

Referring to FIG. 9, a schematic diagram of a switchable object with first seal (barrier) 135 and second seal 137 is shown generally at 140. Active layer 131 is disposed between substrates 132 and layer 138. Substrate 132 may include a conductive layer (not shown). In one embodiment, active layer 131 comprises an indicator material and substrate 132 comprises a trigger material. In another embodiment, active layer 131 comprises a trigger material, and substrate 132 comprises an indicator. Active layer 131 and substrate 132 are separated by layer 138—where the integrity of layer 138 fails or otherwise allows contact of substrate 132 with active layer 131, interaction of the indicator material and trigger material is permitted, and a detectable change occurs.

In another embodiment, substrate 132 comprises an indicator material and a trigger material is a component of the external environment. Where substrate 132 fails, or otherwise allows contact of layer 138 with the external environment, interaction of the indicator material and trigger material is permitted and a detectable change occurs.

For clarity, the embodiments of FIGS. 8 and 9 are shown as separate diagrams; it is contemplated that a switchable object may incorporate both the seal configuration like that of FIG. 8, and the layer configuration like that of FIG. 9. In an embodiment comprising both, active layer 131 may comprise an indicator, and substrate 132 and second seal 134 each comprise a trigger material; the trigger material may be the same or different. In another embodiment, active layer 131 may comprise a trigger, and substrate 132 and second seal 134 each comprise an indicator material; the indicator material may be the same or different. In another embodiment, the first seal 136 and layer 138 may each comprise an indicator material, the indicator material may be the same or different, and the trigger may be a component of the external environment.

An indicator material or a trigger material may be mixed in, coated on, or dispersed through a seal, substrate, layer or active layer. The indicator material or trigger material may be soluble in the seal, substrate, layer or active layer; the indicator material or trigger material may be encapsulated. In one embodiment, the indicator material is encapsulated and the trigger material disrupts the encapsulating material to release the indicator. Reaction of the indicator material with a component of the seal, substrate, layer or active layer may effect a detectable change. In some embodiments, the seal, substrate, layer or active layer may comprise a second trigger material to interact with the indicator material to effect the detectable change.

A detectable change may be a colour change. An example of an indicator material may be a dye molecule or dye molecule precursor. A dye molecule may undergo a permanent or temporary change from a first colored state to a second colored state. A dye molecule precursor may interact with a trigger material and be cleaved, or undergo a chemical reaction (reversible or irreversible) with the trigger material, and change from a first colored state to a second colored state. A first colored state and a second colored state may each independently be any color, or may be fluorescent, or may be colourless or substantially colourless.

In some embodiments, the detectable change may be a change in solubility of an indicator material, where contact of the indicator material and trigger material induces precipitation of the indicator material, changing the optical clarity, or light transmittance of the indicator material, or device component (e.g. substrate, layer, seal or active layer) comprising the indicator material.

In another embodiment, the indicator material and trigger material may be encapsulated in layered microcapsules, where the material used for encapsulation maintains the indicator and trigger in separate compartments. The material for encapsulation may be solubilized or otherwise disrupted by a component of the active layer e.g. a solvent or plasticizer. The encapsulated indicator and trigger materials may be incorporated into the second seal material—when the first seal is compromised, the indicator and trigger are released by interaction with the component of the active layer and a detectable change may be observed. Such an embodiment may be advantageous in that no additional materials are added to the active layer, minimizing the complexity of the active layer formulation.

Where the active layer is switchable between light and dark states with a reduction or oxidation event, inclusion of a redox indicator, or an oxidant or reductant as an indicator material in a first or a second seal material may be useful. In another embodiment, the redox indicator or oxidant or reductant may be incorporated into the second seal material—when the first seal is compromised, the indicator undergoes oxidation or reduction and a detectable change may be observed. The indicator material may be encapsulated, and the material used for encapsulation may be solubilized or otherwise disrupted by a component of the active layer. The indicator material, trigger material, or both indicator and trigger material may be dispersed in one or more carrier fluids, as a dispersion, suspension or emulsion, or dissolved in a carrier fluid. Where the indicator and/or trigger material is encapsulated, the carrier fluid may be compatible (non-disruptive) of the encapsulating material.

Examples of dyes or dye precursors include redox indicators, halochromic indicators, inorganic oxidants or reductants. Examples of inorganic oxidants or reductants include potassium permanganate and potassium dichromate. Redox indicators may be pH dependent, or pH independent. Examples of redox indicators are set out in Table 1:

TABLE 1

Redox indicators

| Indicator | $E^0$, V | $E^0$, V at pH = 0 | $E^0$, V at ph = 7 |
|---|---|---|---|
| (pH independent) | | | |
| 2,2'-bipyridine (Ru complex) | +1.33 V | | |
| Nitrophenanthroline (Fe complex) | +1.25 V | | |
| N-Phenylanthranilic acid | +1.08 V | | |
| 1,10-Phenanthroline iron(II) sulfate complex | +1.06 V | | |
| N-Ethoxychrysoidine | +1.00 V | | |
| 2,2'-Bipyridine (Fe complex) | +0.97 V | | |
| 5,6-Dimethylphenanthroline (Fe complex) | +0.97 V | | |
| o-Dianisidine | +0.85 V | | |

TABLE 1-continued

Redox indicators

| Indicator | $E^0$, V | $E^0$, V at pH = 0 | $E^0$, V at ph = 7 |
|---|---|---|---|
| Sodium diphenylamine sulfonate | +0.84 V | | |
| Diphenylbenzidine | +0.76 V | | |
| Diphenylamine | +0.76 V | | |
| Viologen (pH dependent) | −0.43 V | | |
| Sodium 2,6-dibromophenol-indophenol | | +0.64 V | +0.22 V |
| Sodium o-Cresol indophenol | | +0.62 V | +0.19 V |
| Thionine | | +0.56 V | +0.06 V |
| Methylene blue | | +0.53 V | +0.01 V |
| Indigotetrasulfonic acid | | +0.37 V | −0.05 V |
| Indigotrisulfonic acid | | +0.33 V | −0.08 V |
| Indigo carmine | | +0.29 V | −0.13 V |
| Indigomono sulfonic acid | | +0.26 V | −0.16 V |
| Phenosafranin | | +0.28 V | −0.25 V |
| Safranin T | | +0.24 V | −0.29 V |
| Neutral red | | +0.24 V | −0.33 V |

Examples of halochromic indicators include leuco dyes; some examples of halochromic indicators may include gentian violet (methyl violet 10b) (transition pH range 0.0-2.0), malachite green (first transition pH 0.0-2.0), malachite green (second transition pH 11.6-14), thymol blue (first transition pH1.2-2.8), thymol blue (second transition pH 8.0-9.6), methyl yellow (pH 2.9-4.0), bromophenol blue (pH 3.0-4.6), congo red (pH 3.0-5.0), methyl orange (pH 3.1-4.4), screened methyl orange (first transition pH 0.0-3.2), screened methyl orange (second transition pH 3.2-4.2), bromocresol green (pH 3.8-5.4), methyl red (pH 4.4-6.2), azolitmin (pH 4.5-8.3), bromocresol purple (pH 5.2-6.8), bromothymol blue (pH 6.0-7.6), phenol red (pH 6.4-8.0), neutral red (pH 6.8-8.0), naphtholphthalein (pH 7.3-8.7), cresol red (pH 7.2-8.8), cresolphthalein (pH 8.2-9.8), phenolphthalein (pH 8.3-10.0), thymolphthalein (pH 9.3-10.5), alizarine yellow R (pH10.2-12.0).

Examples of trigger materials include those that may cause or induce a pH change in a local environment (e.g. acids or bases); a pH change may trigger a color change in a halochromic indicator. Examples of trigger materials include propionic acid, butyric acid, valeric acid, caproic acid, caprylic acid, capric acid, lauric acid, myristic acid, palmitic acid, stearic acid, cyclohexanoic acid, phenylacetic acid, benzoic acid, toluic acid, chlorobenzoic acid, bromobenzoic acid, nitrobenzoic acid, phthalic acid, isophthalic acid, terephthalic acid, salicylic acid, hydroxybenzoic acid and aminobenzoic acid, or the like.

Examples of materials that may be used to encapsulate indicator materials or trigger materials include Acrylonitrile-Butadiene-Styrene (ABS) Copolymer, Acrylonitrile-Methyl acrylate copolymer, acylonitrile-styrene-acrylate copolymer, amorphous nylon, arabinogalacatan, beeswax, carboxymethylcellulose, carnauba, cellulose, cellulose acetate phthalate, cellulose nitrate, cyclic olefin copolymer, epoxy resin, ethylcellulose, ethylene, ethylene-chlorotrifluoroethylene copolymer, ethylene-tetrafluoroethylene copolymer, ethylene-vinyl acetate copolymer, ethylene-vinyl alcohol copolymer, fluorinated ethylene-propylene copolymer, stearyl alcohol, gelatin, glyceryl stearate, glycol modified polycyclohexylenedimethylene terephthalate, gum arabic, hexafluoropropylene, hydroxyethylcellulose, ionomer, liquid crystal polymer, methylcellulose, nylon, polyvinylpyfrrolidone, paraffin, paraffin wax, perfluoroalkoxy resin, poly (lactide-co-glycolide), polyacrylic acid, polyamide, polyamide, polyamide-imide, polyarlysulfone, polyaryletheretherketone, polyaryletherketone, polybutylene, polybutylene terephthalate, polycarbonate, polychlorotrifluoroethylene, polycyclohexylenedimethylene ethylene terephthalate, polyester, polyethelyene vinyl acetate, polyetherimide, polyethersuflone, polyethylene, polyethylene naphthalate, polyethylene terephthalate, polyethylene/polystyrene alloy, polyethylene-acrylic acid copolymer, polyimide, polymethacrylate, polyolefin plastomers, polyoxymethylene, polyparaxylylene, polyphenylene sulfide, polyphthalamide, polypropylene, polystyrene, polysulfone, polytetrafluoroethylene, polyurea, polyurethane, polyvinyl alcohol, polyvinyl chloride, polyvinyl fluoride, polyvinylidene chloride, shellac, starch, stearic acid, styrene-acrylate, styrene-acrylonitile copolymer, styrene-butadiene block copolymer, styrene-methacrylate, tetrafluoroethylene, urea-formaldehyde resin, vinylidene fluoride terpolymer, zein, latexes, polyacetal, polyacrylate, polyacrylic, polyacrylonitrile, polyamide, polyaryletherketone, polybutadiene, polybutylene, polybutylene terephthalate, polychloroprene, poly ethylene, polyethylene terephthalate, polycyclohexylene dimethylene terephthalate, polycarbonate, polychloroprene, polyhydroxyalkanoate, polyketone, polyester, polyethylene, polyetherimide, polyethersulfone, polyethylenechlorinates, polyimide, polyisoprene, polylactic acid, polymethylpentene, polyphenylene oxide, polyphenylene sulfide, polyphthalamide, polypropylene, polystyrene, polysulfone, polyvinyl acetate, polyvinyl chloride, as well as polymers or copolymers based on acrylonitrile-butadiene, cellulose acetate, ethylene-vinyl acetate, ethylene vinyl alcohol, styrene-butadiene, vinyl acetate-ethylene, and mixtures thereof, or the like.

A trigger material of an external environment may include a material that 'poisons' the switching action of the active material. For switching materials that involve a reduction or oxidation event (e.g. diarylethenes, viologens, phenazines) a material that injects or scavenges electrons may disrupt the reductive or oxidative switch—slowing it down or stopping it altogether. For switching materials that involve migration of an ionic species across, or into or out of, a layer, disruption of the movement of the ionic species may disrupt the switch—slowing it down or stopping it altogether. In other embodiments, the poison may disrupt polymerization of a switching material—preventing it from completing, or inducing undesirable polymerization. In some embodiments, the trigger material from the external environment may include ambient air, or a gas, or a component thereof, e.g. carbon dioxide, oxygen, $H_2S$, water, or other material in the environment external to the active layer. Examples of indicator materials that undergo a detectable change with exposure to water include cobalt (II) chloride, copper (II) sulfate. In some embodiments, the indicator material may be incorporated in a first seal, when the second seal is compromised, water, water vapor or air from the external environment may interact with the indicator material to induce a detectable colour change.

In some embodiments, the indicator material may be responsive to oxygen, and oxygen may be a trigger material. The indicator material may be included in the first seal, and if the second seal is compromised, oxygen in the external environment may interact with the indicator material to provide a detectable change. U.S. Pat. No. 8,647,876 (incorporated herein by reference) discloses several indicator materials that may undergo a colour change, or become chemiluminescent, when exposed to oxygen.

In some embodiments, a first seal may comprise an indicator material and a trigger material may be encapsulated in a layered microcapsule, and the encapsulating material may be water soluble. When the second seal is compromised, water or water vapor from the external environment may disrupt the encapsulation, allowing interaction of the indicator and trigger, providing a detectable change. Examples of water soluble encapsulating materials may include gelatin, gum arabic, starch, polyvinylpyrrolidone, carboxymethylcellulose, hydroxyethylcellulose, methylcellulose, arabinogalacan, polyvinyl alcohol, polyacrylic acid, or a combination thereof, or the like.

In an embodiment, the switching material may include an indicator material; the indicator material may be a diarylethene, and the second seal may include a trigger material; the second seal may be a two-part epoxy, such as that described in U.S. Pat. No. 6,248,204 (incorporated by reference herein), and the trigger material may be an epoxy resin an epoxy resin hardener or both an epoxy resin and an epoxy resin hardener.

Thermoset materials include polymers, rubbers and plastics. Examples of thermoset include polymers with reactive groups. Examples of polymers may include silicones and siloxanes. Examples of reactive groups include vinyl groups, hydride groups, silanol groups, alkoxy or alkoxide groups, amine groups, epoxy groups, carbinol (polyester or polyurethane groups), methacrylate or acrylate groups, mercapto (thiol, polythiol groups), acetoxy, chlorine or dimethylamine groups. Curing or hardening of such materials may be chemical, radiation, temperature or moisture dependent. Examples of radiation curing may include exposure to light (UV light or visible light); examples of temperature curing may include resting the material at an elevated temperature; examples of chemical curing may include a condensation reaction, an addition reaction, vulcanization, or the like. The chemical curing may include a catalyst, or addition of a reactive group to facilitate crosslinking of a polymer. The chemical cure may further be heated to accelerate the curing reaction, or may be cooled to retard the curing reaction.

For example, vinyl functional polymers may be employed in an addition cure system (e.g. Pt catalyzed); hydride functional polymers may be employed in an addition cure system; siloxane functional polymers may be employed in a condensation cure system (e.g. silicones with one part or two part room temperature vulcanization (RTV)), or an acetoxy, enoxy, oxime, alkoxy or amine moisture-cure system.

Thermoplastic materials may include polymers, rubbers and plastics that melt or flow at elevated temperatures, and reversibly set to a non-flowing state at a reduced temperature. Examples of thermoplastic materials include poly(vinyl alcohol), poly(vinylidene chloride), polyvinylidene fluoride, ethylene vinyl acetate (EVA), and polyvinyl butyral (PVB), Examples of rubbers include polyisoprene, polyisobutylene (PIB), poly(isobutylene-co-isoprene), block, copolymer and graft polymer of butadiene-styrene, poly(chlorobutadiene), poly(butadiene-co-acrylonitrile), poly(isobutylene-co-butadiene), acrylate-ethylene containing copolymer rubber, poly (ethylene-co-propylene), poly(ethylene-co-butene), ethylene-propylene-styrene copolymer rubber, poly(styrene-co-isoprene), poly(styrene-co-butylene), styrene-ethylene-propylene copolymer rubber, perfluorinated rubber, fluorinated rubber, chloroprene rubber, silicone rubber, ethylene-propylene-nonconjugated diene copolymer rubber, thiol rubber, polysulfide rubber, polyurethane rubber, polyether rubber (such as polypropylene oxide), epichlorohydrin rubber, polyester elastomer, and polyamide elastomer.

Some illustrative examples of barrier materials include polyisobutylene rubbers, thermoplastic adhesives, EVA (ethylene-vinyl acetate), and butyl rubber (e.g. butyl rubber pressure sensitive adhesive, available from Adhesives Research, Glen Rock, Pa.). Some illustrative examples of seal materials include some epoxies, thermoplastic adhesives.

Switchable Material:

A switchable material as referenced herein may include any solid, semi-solid, gel or liquid material that alters light transmittance in response to a stimulus. An alteration in light transmittance may be a change in one or more of transparency, opacity, color, haze; the reduction in light transmittance may be selective—the a portion of UV, visible or IR light that is transmitted by the switchable material may change, or selective wavelengths be blocked, at least in part. The stimulus may include one or more than one of electricity (an electrochromic switchable material), temperature or temperature change (a thermochromic switchable material), electromagnetic radiation in a range of from about 300 nm to about 750 nm or any amount or range therebetween (UV or visible light) (a photochromic switchable material). Some switchable materials may be responsive to both light and electricity (a photochromic-electrochromic switchable material).

Some switchable materials comprise a polymer or polymer matrix and one or more compounds or compositions that undergo a structural change or orientation in response to the stimulus. For example, a liquid crystal or suspended particle display electrochromic switchable material comprises discrete particles suspended in a liquid or semi-solid polymer matrix, and the alignment of the crystals or particles is controlled by application of electricity. Other examples of electrochromic switchable materials comprise two or more compounds that behave as a redox pair—when electricity is applied, one compound is electrochemically oxidized to a coloured state, and the other is electrochemically reduced to a coloured state. When electricity is removed, the compounds revert to their uncoloured state. Some photochromic materials, when exposed to UV light, change color—darken or fade. Some photochromic materials may have 'memory' in that they remain in the UV-exposed state until a second stimulus is applied; others do not exhibit memory, and will gradually revert to their unexposed state.

Some switchable materials are both photochromic and electrochromic. When exposed to selected wavelengths of light (e.g. UV light), the materials darken. When exposed to electricity, the materials fade. Examples of compounds (chromophores) that may be useful in a photochromic-electrochromic switchable material include some switchable compounds such as photochromic-electrochromic diarylethenes (see, for example U.S. Pat. No. 7,777,055, WO2010/142019 and WO2013/044371). A switchable material comprising one or more of these compounds may be transitionable from a faded state to a dark state with exposure to UV light, and from a dark state to a faded state with application of electricity, or light in the visible range.

Suitable thickness of a switchable material may be dependent on one or more of a desired light transmission in a dark state, a faded state or both a dark state and a faded state; a desired optical clarity (haze), or a desired thickness of a finished switchable article. Examples of thickness ranges include from about 0.1 micron (micrometer, μm) to about 100 microns, or any amount or range therebetween, for example from about 10 microns to about microns, or from about 0.1 micron to about 10 microns, or from about 0.5 micron to about 5 microns, or from about 0.5 micron to about 2.5 micron or any amount or range therebetween. In some embodiments, the layer of switching material is of uniform, or substantially uniform, thickness. In some embodiments, the layer of switching material is of non-uniform thickness. To achieve a desired thickness of switchable material in a final (cured or dried) switchable object, a thicker layer of switchable material may need to be printed, which will contract or reduce as it sets, dries or crosslinks. The thickness of the switchable material may be regulated by the thickness of the screen used for screen printing.

A switchable material may comprise a polymer and a switchable compound, and optionally, one or more of a plasticizer, dye, UV light stabilizer, antioxidant, supporting electrolyte, surfactant, adhesion promoter or adhesion control agent or the like. The switchable material may be a single layer of material (cast or extruded), or maybe two or more layers, cast or extruded sequentially or simultaneously one on top of the other. Generally, the switchable material is substantially optically clear, or with minimal (e.g. less than 3%) haze. The switchable material may comprise adhesive properties. Haze may be measured using methods known in the art, for example use of an XL-211 Hazemeter from BYK-Gardner.

Components of the switchable material may further provide, in part, one or more than one secondary functions. For example, any of a switchable compound, polymer, plasticizer, supporting electrolyte, charge carrier or the like may provide a secondary function as one or more than one of a plasticizer (solvent), polymer, supporting electrolyte, or the like. In another embodiment, where a polymer comprises a switchable compound, the polymer may provide multiple functionalities, including a combination of polymer and switchable compound, and in some embodiments, a charge carrier function, a plasticizer function and/or a supporting electrolyte function. Inclusion of different switchable compounds and/or different polymer backbone moieties may alter the function of the polymer.

Examples of solvents (which may function as plasticizers in the switchable material) include dimethyl adipate, diethyl adipate, 2-(2-butyoxyethoxy) ethyl acetate, triglyme, diethyl succinate, 2,2,4-trimethyl-1,3-pentanediol monoisobutyrate, dimethyl-2-methyl glutarate, butylene carbonate, propylene carbonate, dibutyl itaconate, tetraethylene glycol di-heptanoate, triethylene glycol di-2-ethylhexanoate, triethylene glycol di-2-ethyl butyrate, triethylene glycol di-n-heptanoate, benzyl octyl adipate, di-n-hexyl adipate, triethylene glycol, combinations thereof, or the like.

Examples of supporting electrolytes include tetrabutylammonium tetrafluoroborate ($TBABF_4$), tetrabutylammonium bis((trifluoromethyl)sulfonyl)imide (TBATFSI).

Examples of polymers include ethylene copolymers (e.g. ethylene-vinyl acetate), a polyurethane, a polyalcohol, an ionomer, PVDF, or the like. Examples of polyalcohols include ethylene vinyl alcohol copolymer, polyvinyl alcohol, polyvinyl acetals (e.g. polyvinyl butyral—PVB), poly(ethylene oxide), or the like. Examples of ionomers include poly(ethylene-co-methacrylic acid, PV5300 (DuPont) or the like. In some embodiments the switchable material may comprise a mixture of polymers. In some embodiments, a polymer may be crosslinked with one or more crosslinking agents. A crosslinking agent may comprise two or more reactive groups; reactive groups may independently be, for example, aldehyde, epoxide, isocyanate, silane or the like. Examples of aldehyde crosslinkers include terephthalaldehyde and the like. Examples of epoxides include diglycidyl ethers of polypropylene glycol (e.g. DER736, DER732, both from Dow Chemical), bisphenol A diglycidyl ether (BADGE), 1,4-butanediol diglycidyl ether, 1,4-cyclohexanedimethanol diglycidyl ether, and the like. Examples of isocyanate crosslinking agents include hexamethylene diisocyanate (HMDI), dimers, trimers, or multimers of HMDI (e.g. DESMODUR™ N100, N3300A, N3600 from Bayer) and the like. In some embodiments a catalyst may be included to accelerate the crosslinking reaction. An example of a catalyst is zinc octoate or KKAT 6212 (King Industries); others may be suitable.

The one or more supporting electrolytes may be absent, or present in an amount of from about 0.1% to about 20% (by weight) or any amount or range therebetween, for example 1, 2, 3, 4, 5, 6, 7, 8, 9, 10, 11, 12, 13, 14, 15, 16, 17, 18 or 19%. The one or more plasticizers (solvents) may be absent, or may be present in a switchable material in an amount ranging from about 5 wt % to about 90 wt % or any amount or range therebetween. The one or more switchable compounds may be present in a switchable material in an amount (% weight) of from about 0.05% to about 80%, or any amount or range therebetween, for example about 5, 10, 15, 20, 25, 30, 35, 40, 45, 50, 55, 60, 65, 70 or 75%. The polymer may be present in an amount of from about 10 wt % to about 95 wt %, or any amount or range therebetween, for example 15, 20, 30, 40, 50, 60, 70, 80 or 90 wt %.

A switchable material may be prepared so as to have suitable flow and viscosity to pass through the screen and self-level once coated on a substrate or in a mask. With removal of some or all of a solvent component, and/or crosslinking, a switchable material may be made sufficiently strong to resist deformation when the mask is removed, or when cut to shape, or when a second substrate is applied and pressure applied with a hand roller or a nip-roller. Additional additives may be included in a switchable material to alter one or more properties for screen printing, handling, dispersion on a surface or substrate, increasing or decreasing tack or the like. Examples of such additives may include a deaerating additive (e.g. TEGO™ Airex additives), a defoaming additive (e.g. TEGO™ Foamex additives), a surface control additive (to modulate flow or levelling, and/or reduce cratering—e.g. BYK-307, BYK, 313, BYK-300, TEGO™ Flow or TEGO™ Glide additives), a hydrophobing agent (e.g. TEGO™ Phobe additives), a setting additive, a dispersing additive (e.g. TEGO™ Dispers additives), a rheological additive (e.g. TEGO™ ViscoPlus additive), an anti-cratering additive (e.g. TEGO™ Wet or TEGO™ Twin additives), or the like. TEGO™ additives are available from Evonik Industries (Essen, Germany).

Additives that may provide one or more of the above-referenced property alterations may include hydrophobized silicon dioxide particles, polyolefins, organo-modified polysiloxanes, fumed silica, precipitated silica, polyolefin graft poly(meth)acrylate copolymer adhesion promoters, (poly) ether alcohols, polyester-modified polydimethyl siloxanes, or the like.

Examples of such additives are described in U.S. Pat. Nos. 8,882,901, 8,802,744, 8,614,256, 8,501,861, 8,426,478, 8,377,193, 8,007,751, 7,834,098, 8,883,932, 8,772,423, 8,349,441, 8,597,789, all of which are incorporated herein by reference.

Substrates:

The one or more transparent, or substantially transparent, substrates may be glass—float glass, tempered glass, toughened, or chemically-strengthened glass, an organic glass or the like. The substrate may be flexible (e.g. plastic film, glass film, flexible glass or glass microsheet). For continuous production methods, a flexible substrate that can be unwound from a roll, and wound up for storage or handling after printing may be preferable. An organic glass is an amorphous, solid glasslike material made of transparent plastic. Organic glass may provide advantages such as toughness, reduced weight, improved thermal insulation, ease of colour modification (incorporation of colorants in the plastic when molding) or the like. Examples of organic glasses or plastics include polycarbonate, acrylonitrile butadiene styrene, polyesters (polyethylene terephthalate (PET), modified PET), acrylics (polymethyl methacrylate) or modified acrylics (e.g. imidized, rubber toughened, stretched or the like), polyester carbonate, allyl diglycol carbonate, polyether imide, polyether sulfone (polysulfone, PSU), cellulose acetate, cellulose butyrate, cellulose propionate, polymethyl pentene, polyolefins, nylon, polyphenylsulfone, polyarylate, polystyrene, polycarbonate, polysulfone, polyurethane, polyvinyl chloride, styrene acrylonitrile, ethylene vinyl acetates, or the like. Substrates may independently be coated with, or comprise anti-scratch layers, security films, heat or infrared reflecting or absorbing materials, or UV reflecting or absorbing materials or the like. Substrates may independently be tinted any suitable color and/or may comprise coatings or additives to block some wavelengths of light (e.g. portions of UV, VIS, IR incident light or the like).

The substrate may be of uniform or varying thickness, and of any suitable dimension. For example, the substrate may have a thickness from about 0.01 mm to about 10 mm, or any amount or range therebetween, for example 0.05, 0.1, 0.5, 1, 2, 3, 4, 5, 6, 7, 8, 9 or 10 mm, or from about 0.012 mm to about 10 mm, or from about 0.5 mm to 10 mm, or from about 1 mm to 5 mm, or from about 0.024 mm to about 0.6 mm, or from about 0.051 mm (2 mil) to about 0.178 mm (7 mil). In some embodiments, the thickness and/or material of a first substrate differs from the thickness and/or material of a second substrate.

Transparent conductive layers or coatings on a substrate may include a transparent conducting oxide (TCO) such as indium tin oxide (ITO), fluorine tin oxide (FTO) or the like, metal or metal oxide coatings (e.g. silver, gold or the like), transparent conducting polymers, or other substantially transparent conductive coatings. Examples of transparent substrates with conductive coatings include ITO-coated glass, or FTO-coated glass (e.g. TEC glass from Pilkington). For embodiments comprising co-planar electrodes, the electrode pattern (e.g. interdigitated electrodes such as that illustrated) may be etched into a conductive coating on the substrate, or printed on a substrate. In some embodiments, a substrate with a conductive layer may be ITO-coated glass, or ITO-coated PET.

Some methods of manufacture of conductive coatings may necessitate use of selected substrates that tolerate the coating methods. For example, FTO coatings may be less expensive, and thus an attractive substrate and conductive coating, but require a substrate that tolerates the high temperatures (>400° C.) used in some coating methods. Having a switchable material that may be laminated between FTO-coated substrate may provide a less expensive laminated glass.

In some embodiments, both first and second electrodes may be disposed on one substrate. First and second coplanar electrodes may be etched into the conductive coating or printed on the surface of the substrate in a suitable pattern e.g., a discontinuous conductive coating providing first and second electrodes on the same substrate. In such embodiments, a second substrate may lack a conductive coating, and first and second bus bars and electrical connectors may be disposed on the first and second electrodes of the first substrate. In such embodiments, the second substrate (lacking a conductive coating) may be a plastic or glass, or a film or release liner. PCT publication WO2012/079159 describes coplanar electrode configurations that may be useful in some embodiments.

Control circuits and systems that may be used with an apparatus comprising a switchable material are described in, for example, PCT publication WO2010/142019.

EXAMPLES

Example 1: Printable Switching Material

Co-solvent components cyclohexanone, 2-ethoxyethyl acetate, dibasic ester or dimethyl-2-methyl glutarate were tested in a mock switching material (no crosslinking package) for suitability in screen printing (Table 2). Dibasic ester is a mixture of dimethyl glutarate, dimethyl succinate and dimethyl adipate with methanol (Sigma). Compositions were assessed for ability to wet the mesh screen, printability (pressing through the mesh), and reusability of the mesh after a first print. A plastic mesh screen print mask (80 mesh screen; 70.5% of open area) was used, and a hard and sharp 75 A durometer squeegee was pulled across the screen at a speed of about 0.75 feet/second to distribute the switchable material.

TABLE 12

Non-crosslinking switchable materials for screen printing. PVB-6 is a polyvinylbutyral resin (Kuraray) (MW 250-300K, 12-16% PVOH content; 1-4% PVA content); PVB-8 is a polyvinyl butyral resin (Butvar, Eastman) (MW 170-250K, 17.5-20% PVOH content, 0-2.5% PVA content).

| Component | wt % |
|---|---|
| Chromophore #1 | 5 |
| PVB-8 | 5 |
| PVB-6 | 10 |
| TBATFSI | 5 |
| dimethyl-2-methyl glutarate | 75 |
| Co-solvent component | 1.5 eq |

A cyclohexanone-containing formulation did not wet the screen sufficiently; it was found to be too viscous and was not printable. Formulations with the other three cosolvents (dimethyl-2-methyl glutarate, 2-ethoxyethyl acetate or dibasic ester) wet the screen, and were printable.

Chromophore #1

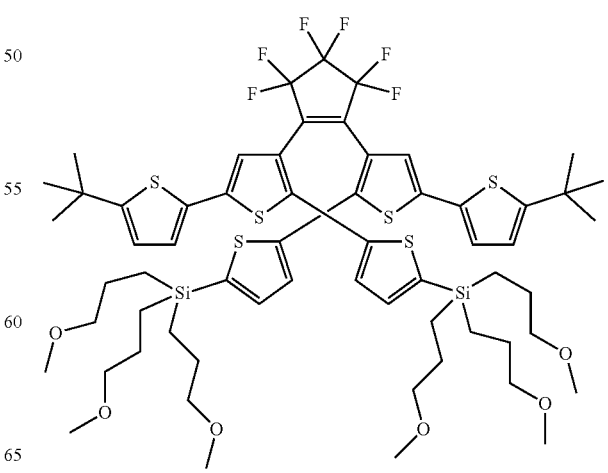

Example 2: Screen Printing

A second switchable material composition (Table 3) was prepared, omitting the PVB-8 polymer, and increasing the PVB-6 and dimethyl-2-methyl glutarate (no co-solvent) was prepared and assessed as per Example 1. Omission of one of the polymers decreased the viscosity of the switchable material, allowing it to be coated, wet the screen and print without need for a co-solvent component.

TABLE 3

Non-crosslinking switchable materials for screen printing.

| Component | wt % |
|---|---|
| Chromophore #1 | 5 |
| PVB-6 | 8 |
| TBATFSI | 5 |
| dimethyl-2-methyl glutarate | 82 |

Example 3: Printing Over Barrier Material Mask

A butyl rubber pressure sensitive adhesive (PSA) barrier material, cut to provide a ski goggle lens-shaped opening using a laser cutter, was applied to a substrate, forming a mask with a centre space to receive a switchable material. The exposed surface of the seal material was covered by a release liner to protect the adhesive surface.

The switchable material (Table 4) was screen-printed onto the substrate material in the region defined by the mask, using an 80 mesh screen (70.5% of open area). A hard and sharp 75 A durometer squeegee was pulled across the screen at a speed of about 0.75 feet/second to distribute the switchable material. This provided the proper "wet" thickness and allowed for uniform coverage. The switchable material was mixed in two parts to prolong pot life.

TABLE 4

Co-solvent free switchable material for screen printing.

| Component | Part A Weight Percent | Part B Weight Percent |
|---|---|---|
| Chromophore #1 | 2.5 | 2.5 |
| PVB-6 | 4.5 | 4.5 |
| TBATFSI | 2.5 | 2.5 |
| dimethyl-2-methyl glutarate | 40.1 | 41.3 |
| KKAT 6212 | 0.40 | — |
| Desmodur N3600 | — | 0.21 |

Immediately following application, the switchable material had a mottled appearance. The coated, masked substrate was subsequently dried in a conveyor oven (80 seconds, 55° C.; Rolt 5M-3 Dryer Mkt) to remove a portion of the solvent. The formulation self-levelled (a self-levelling material) in the conveyor oven, and provided a sufficiently firm layer of switching material to resist distortion when the release liner was removed, and a second substrate was applied and the barrier material sealed by passing through a nip roller. Table 5 sets out the weight percent of some switchable material components before and after drying. After settling and curing over night the prints showed minimal optical defects and good uniformity and smoothness of the formulation. After curing, the switchable object was trimmed to size.

TABLE 5

Switchable material composition - pre- and post-drying.

| Initial composition | | Post-drying composition | |
|---|---|---|---|
| Component | Weight Percent | Component | Weight Percent |
| Chromophore #1 | 5 | Chromophore #1 | 7.5 |
| TBATFSI | 5 | TBATFSI | 7.5 |
| PVB-6 | 8 | PVB-6 | 11.9 |
| dimethyl-2-methyl glutarate | 82 | dimethyl-2-methyl glutarate | 73.1 |

Example 4: Continuous Slot Die Coating Over Barrier Material Mask

A butyl rubber pressure sensitive adhesive (PSA) barrier material, cut to provide a ski goggle lens-shaped opening using a laser cutter, was applied to a continuous web substrate (for roll-to-roll coating), forming a mask with a centre space to receive a switchable material. The exposed surface of the barrier material was covered by a release liner to protect the adhesive surface.

The switchable material (Table 6) was coated onto the substrate over the mask area using a slot die coater head (die-substrate gap 125 micron; die-shim gap 125 micron; line speed 100 cm/minute). Release liner was removed immediately after coating, continuously wound up as the web progressed. Co-solvent was removed by passing the coated substrate through a drier at ambient temperature, and a second substrate applied and the barrier material, switchable material and substrates pressed together by passing through a nip roller. The coated, masked switchable material was wound onto an uptake spool, and allowed to cure. After curing, the switchable object was cut out of the web using a laser cutter.

TABLE 6

Switchable material for slot die coating over barrier material mask

| Component | wt % |
|---|---|
| Chromophore #1 | 5 |
| PVB-8 | 5 |
| PVB-6 | 10 |
| TBATFSI | 5 |
| dimethyl-2-methyl glutarate | 67 |
| 1,2-butylene carbonate | 7.4 |
| Desmodur N3600 | 0.26 |
| K-Kat 6212 catalyst | 0.4 |
| THF co-solvent | 1.5 eq |

OTHER EMBODIMENTS

It is contemplated that any embodiment discussed in this specification can be implemented or combined with respect to any other embodiment, method, composition or aspect, and vice versa. Figures are not drawn to scale unless otherwise indicated.

The present invention has been described with regard to one or more embodiments. However, it will be apparent to persons skilled in the art that a number of variations and modifications can be made without departing from the scope of the invention as defined in the claims. Therefore, although various embodiments of the invention are disclosed herein, many adaptations and modifications may be made within the scope of the invention in accordance with the common general knowledge of those skilled in this art. Such modifications include the substitution of known equivalents for any aspect of the invention in order to achieve the same result in substantially the same way. Numeric ranges are inclusive of the numbers defining the range. In the specification, the word "comprising" is used as an open-ended term, substantially equivalent to the phrase "including, but not limited to," and the word "comprises" has a corresponding meaning. As used herein, the singular forms "a", "an" and "the" include plural referents unless the context clearly dictates otherwise. Citation of references herein shall not be construed as an admission that such references are prior art to the present invention, nor as any admission as to the contents or date of the references. All publications are incorporated herein by reference as if each individual publication was specifically and individually indicated to be incorporated by reference herein and as though fully set forth herein. The invention includes all embodiments and variations substantially as hereinbefore described and with reference to the examples and drawings.

Unless defined otherwise, all technical and scientific terms used herein have the same meaning as is commonly understood by one of ordinary skill in the art to which this invention belongs. If a definition set forth in this section is contrary to or otherwise inconsistent with a definition set forth in the documents that are herein incorporated by reference, the definition set forth herein prevails over the definition that is incorporated herein by reference.

What is claimed is:

1. A method of making a switchable object, comprising:
   applying switchable material on a first substrate;
   applying a second substrate over a top of, and in contact with, the switchable material;
   cutting a first bus-bar platform by performing a first kiss cut on the first substrate, thereby removing a portion of the first substrate to provide the first busbar platform, wherein the first kiss cut is performed by a laser; and
   applying a barrier material on the first substrate,
   wherein the barrier material is applied before applying the switchable material, and
   wherein the method further comprises removing a portion of the barrier material by performing a third kiss cut.

2. The method of claim 1, wherein the laser is a pulsed beam.

3. The method of claim 1, wherein the laser is from about 0.1 to about 5 W.

4. The method of claim 1, wherein the laser is a CO2 laser.

5. The method of claim 1, wherein the laser has a wavelength of from about 9 to about 11 microns.

6. The method of claim 1, wherein the first kiss cut is performed under an inert gas blanket.

7. The method of claim 1, further comprising:
   cutting a second bus-bar platform by performing a second kiss cut on the second substrate, thereby removing a portion of the second substrate to provide the second busbar platform.

8. The method of claim 7, wherein the second kiss cut is performed by a laser.

9. The method of claim 7, further comprising, after performing the first kiss cut and before performing the second kiss cut, inverting the switchable object.

10. The method of claim 7, wherein the second kiss cut cuts through the second substrate and a portion of the switchable material, and does not contact the first substrate.

11. The method of claim 1, wherein the first kiss cut cuts through the first substrate and a portion of the switchable material, and does not contact the second substrate.

12. The method of claim 1, wherein the third kiss cut is performed by a laser.

13. The method of claim 1, wherein the barrier material is applied after applying the switchable material, and wherein the barrier material, the first substrate, and the second substrate encapsulate the switchable material.

14. The method of claim 1, wherein the first substrate, the second substrate, or the first and the second substrates, comprise a transparent conductive layer.

15. The method of claim 1, wherein the first substrate, the second substrate, or the first and the second substrates, comprise a patterned transparent conductive layer, the patterned transparent conductive layer comprising at least two electrodes, and wherein the transparent conductive layer is selected from the group consisting of: gold, indium tin oxide, metal oxide, fluorine tin oxide, silver, carbon, graphene, carbon nanotubes, silver wire, and a combination thereof.

16. The method of claim 1, wherein the laser is from about 0.5 to about 2 W.

17. A method of making a switchable object, comprising:
   applying switchable material on a first substrate;
   applying a second substrate over a top of, and in contact with, the switchable material;
   cutting a first bus-bar platform by performing a first kiss cut on the first substrate, thereby removing a portion of the first substrate to provide the first busbar platform, wherein the first kiss cut is performed by a laser; and
   applying a seal material.

18. A method of making a switchable object, comprising:
   applying switchable material on a first substrate;
   applying a second substrate over a top of, and in contact with, the switchable material;
   cutting a first bus-bar platform by performing a first kiss cut on the first substrate, thereby removing a portion of the first substrate to provide the first busbar platform, wherein the first kiss cut is performed by a laser; and
   applying a barrier material on the first substrate, wherein the switchable material is photochromic and electrochromic.

\* \* \* \* \*